(12) United States Patent  (10) Patent No.: US 8,872,042 B2
Cordes et al.  (45) Date of Patent: Oct. 28, 2014

(54) METHODS AND SYSTEMS FOR PROVIDING INFLATABLE LIGHTWEIGHT SHIELDED ENCLOSURES

(75) Inventors: Marc Cordes, Arlington, VA (US); Paul LaHaye, Arnold, MD (US)

(73) Assignee: InTech Defense, LLC, McLean, VA (US)

( * ) Notice: Subject to any disclaimer, the term of this patent is extended or adjusted under 35 U.S.C. 154(b) by 41 days.

(21) Appl. No.: 13/471,401

(22) Filed: May 14, 2012

(65) Prior Publication Data

US 2012/0292095 A1 Nov. 22, 2012

Related U.S. Application Data

(60) Provisional application No. 61/510,572, filed on Jul. 22, 2011, provisional application No. 61/485,606, filed on May 12, 2011.

(51) Int. Cl.
*H05K 9/00* (2006.01)

(52) U.S. Cl.
CPC .................................. *H05K 9/0001* (2013.01)
USPC .......................................... 174/380; 52/2.18

(58) Field of Classification Search
USPC ................. 174/364, 380; 52/79.5, 2.11, 2.18; 472/134
See application file for complete search history.

(56) References Cited

U.S. PATENT DOCUMENTS

| | | | | | |
|---|---|---|---|---|---|
| 3,390,491 | A | * | 7/1968 | Hayden et al. | 174/379 |
| 3,497,606 | A | * | 2/1970 | Andrews et al. | 174/379 |
| 4,371,175 | A | * | 2/1983 | Van Dyk, Jr. | 174/357 |
| 6,011,504 | A | * | 1/2000 | Tan | 342/4 |
| 8,530,756 | B1 | * | 9/2013 | Winch | 174/382 |
| 2003/0101660 | A1 | * | 6/2003 | Brereton | 52/2.11 |
| 2009/0124402 | A1 | * | 5/2009 | Amberg | 472/134 |

* cited by examiner

*Primary Examiner* — Hung Ngo
(74) *Attorney, Agent, or Firm* — Capitol Patent & Trademark Law Firm, PLLC

(57) ABSTRACT

An inflatable, lightweight shielded enclosure that includes one or more inflatable, lightweight shielded beams arranged to support a shielded material, and an inflatable, lightweight shielded connection system for connection to a control system is provided along with related methods. The enclosure may have a weight of approximately twenty-one pounds, and provide an attenuation of 70 dB to 80 dB for a 1 GHz signal.

20 Claims, 33 Drawing Sheets

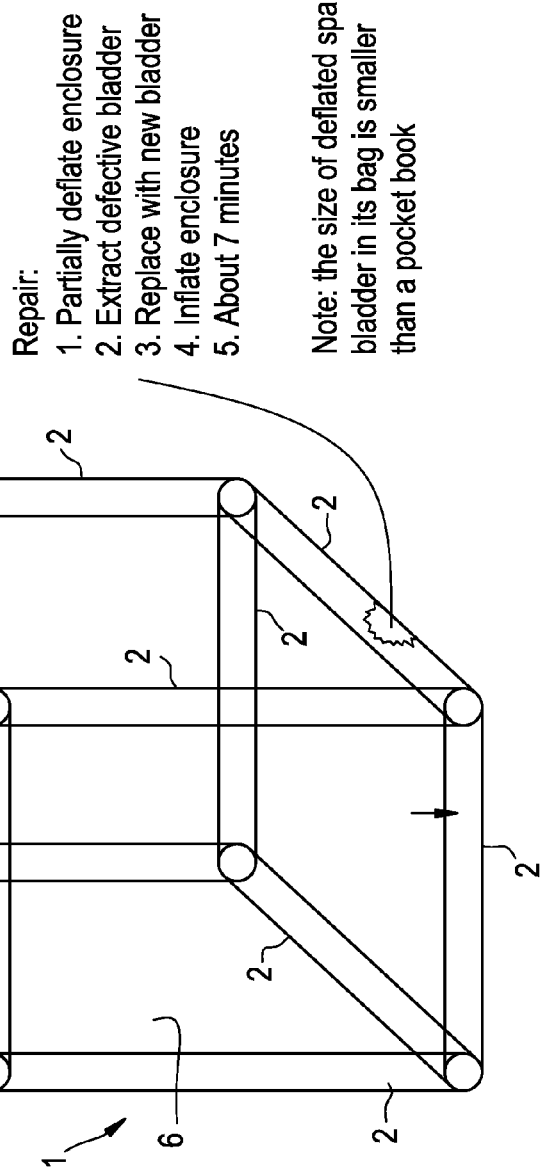

FIG. 3

Central inflation valve and 12 independent bladders (this particular enclosure) allow for ease of use while allowing ease of repair, during mission, if one bladder is damaged.

For some applications structure can be composed of bladders which support more than one side; for example in this application the number of bladders could be from one to twelve and any combination in between.

Repair:
1. Partially deflate enclosure
2. Extract defective bladder
3. Replace with new bladder
4. Inflate enclosure
5. About 7 minutes Note: the size of deflated spare bladder in its bag is smaller than a pocket book FIG. 6
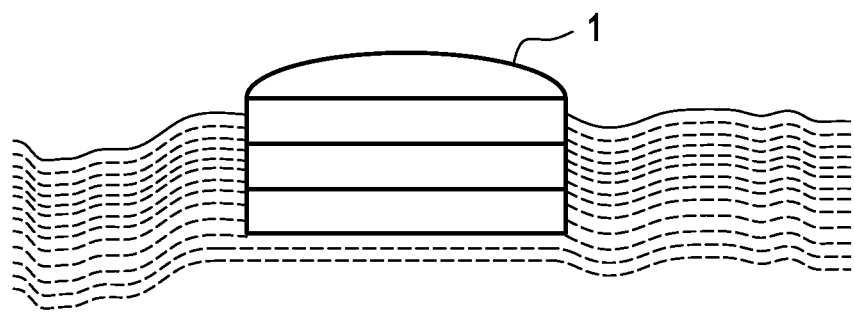
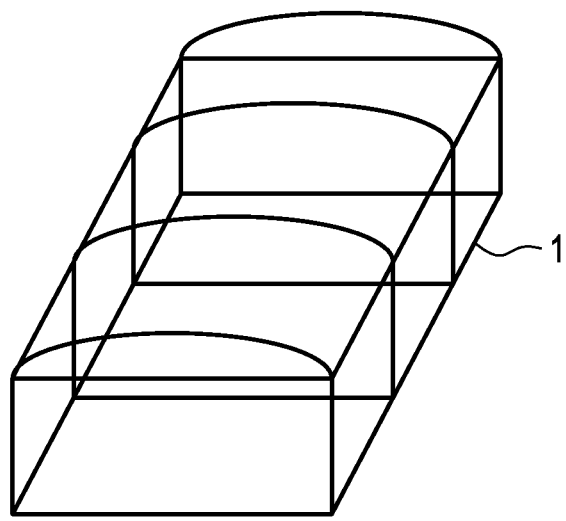

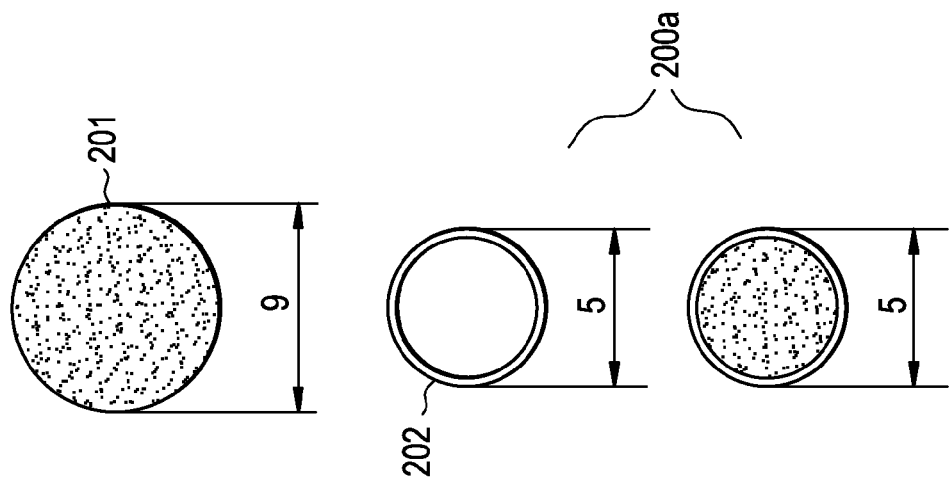
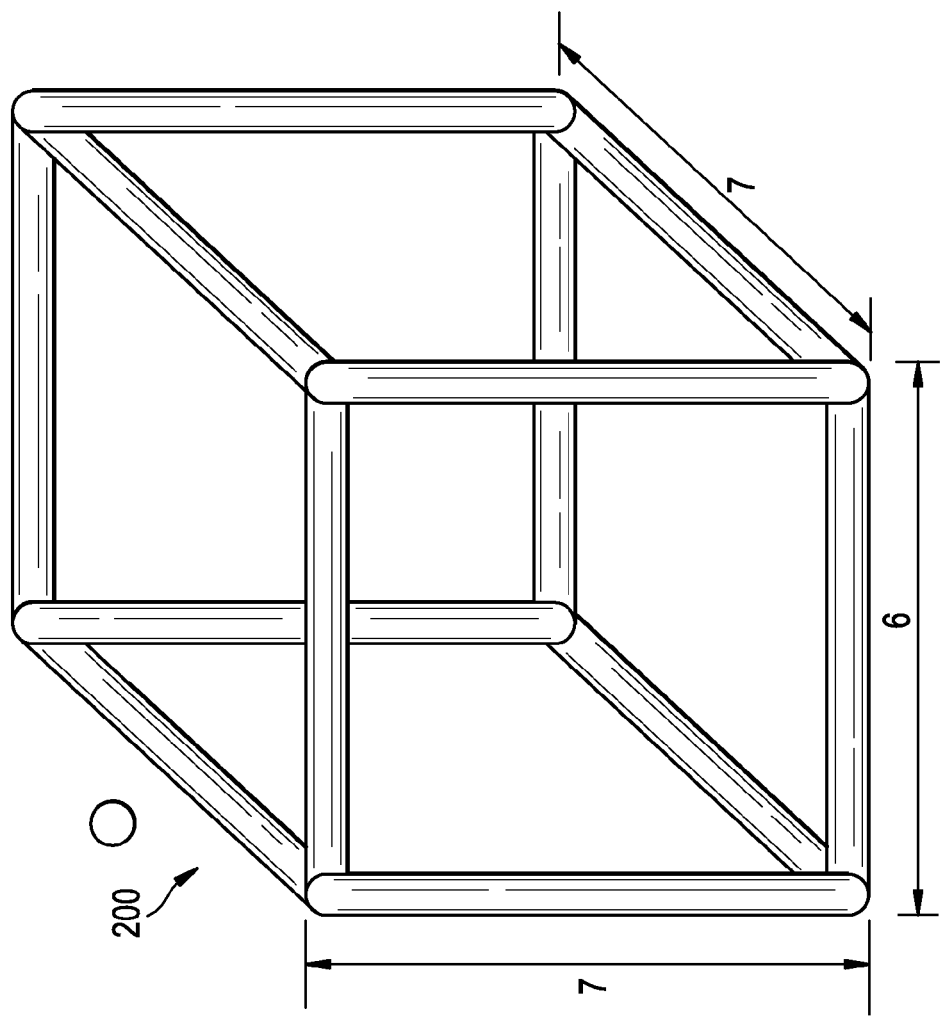
FIG. 12

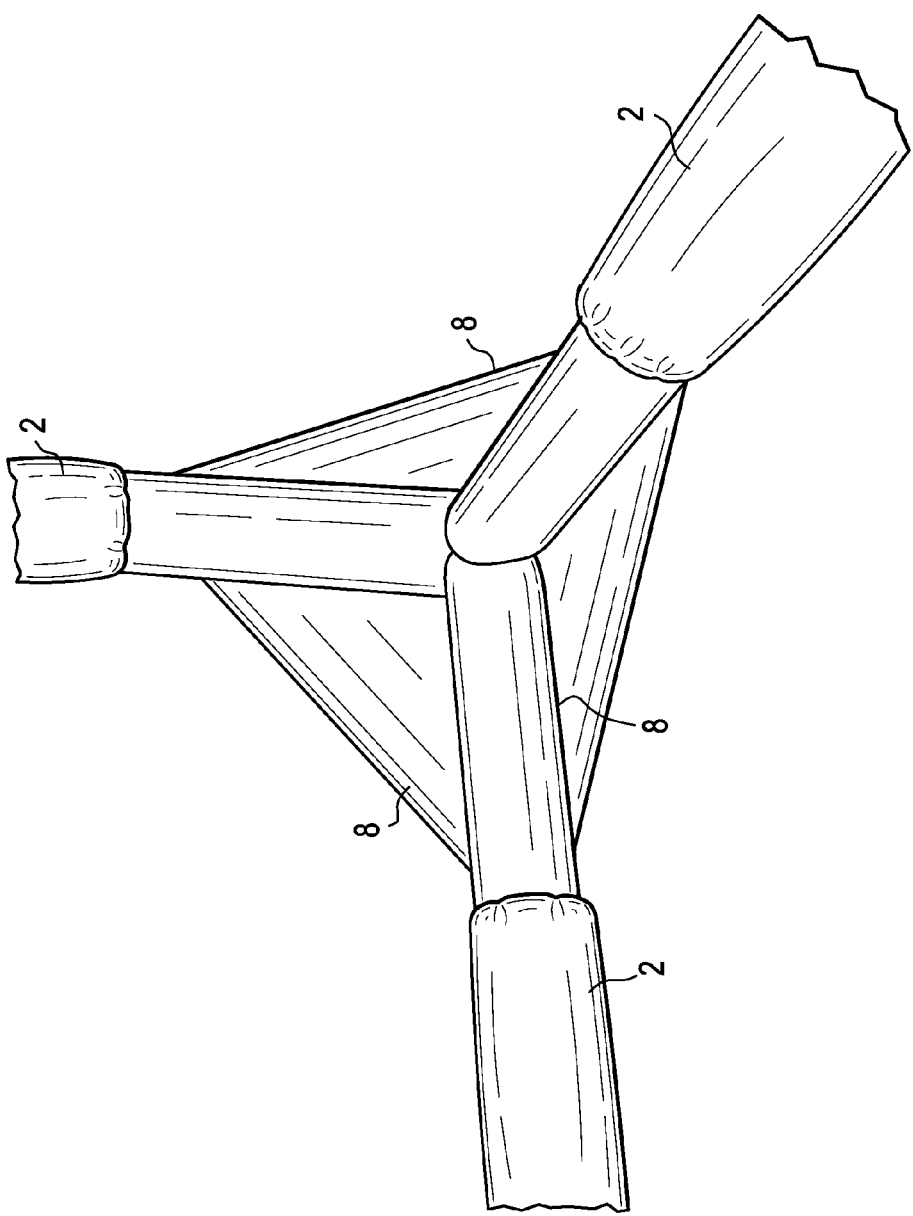

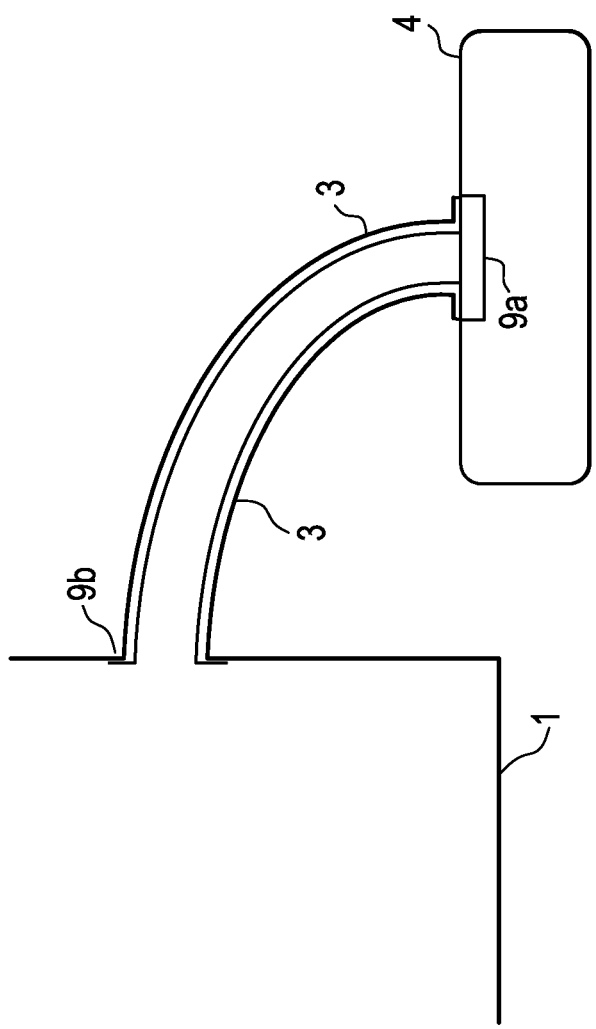
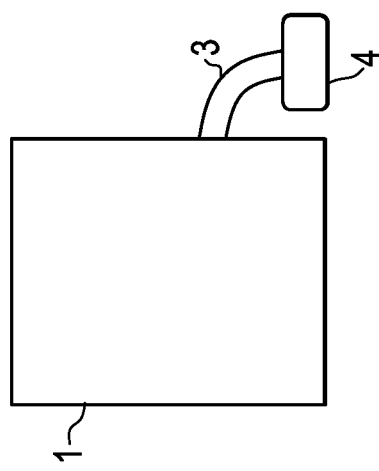
FIG. 14B
FIG. 14A

Redundant seal systems:
1 Inner trunk Velcro to enclosure
2 Outer trunk hooks up to support system
3 Inner trunk seals inside outer trunk with air pressure

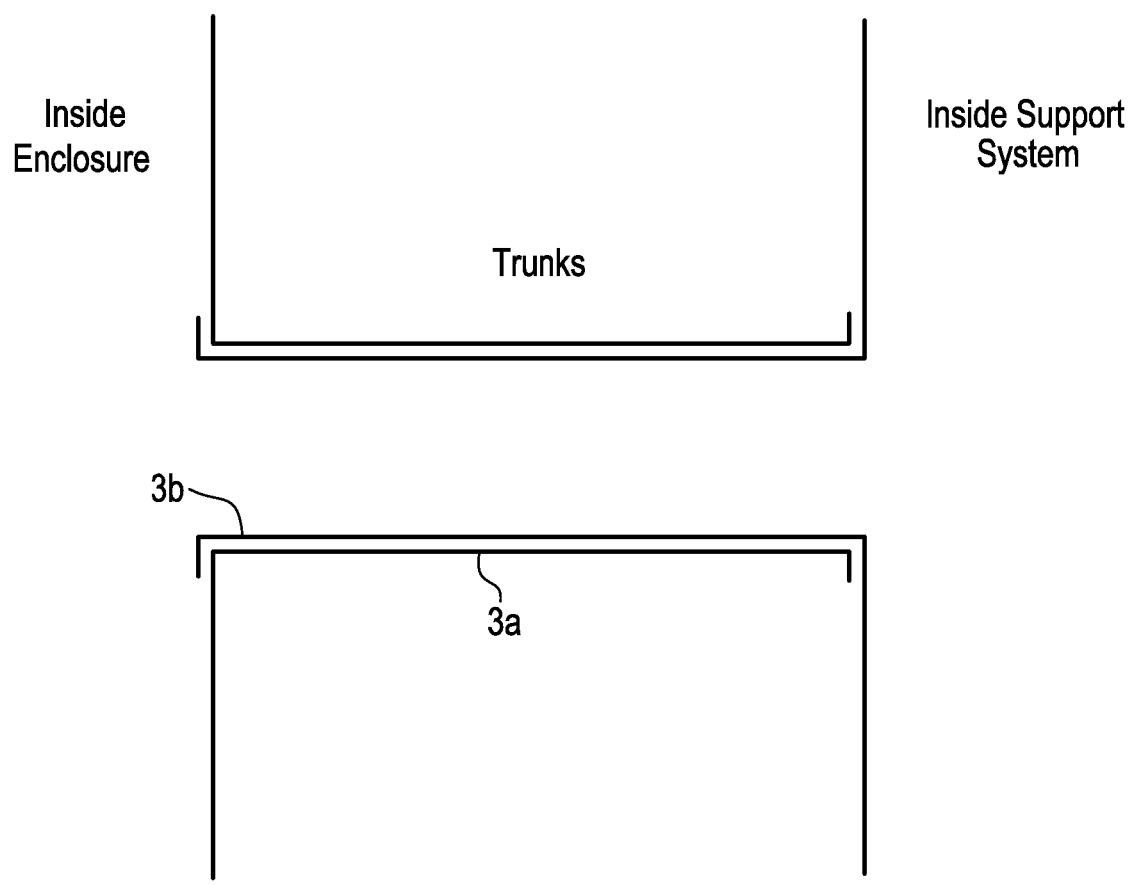

FIG. 17B
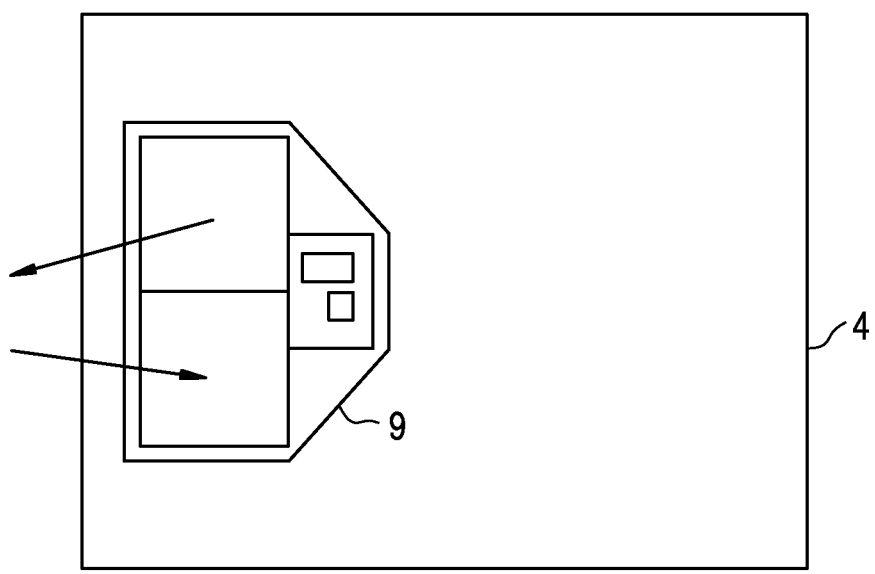
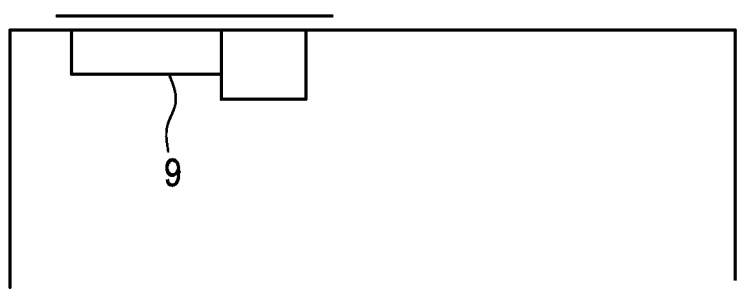

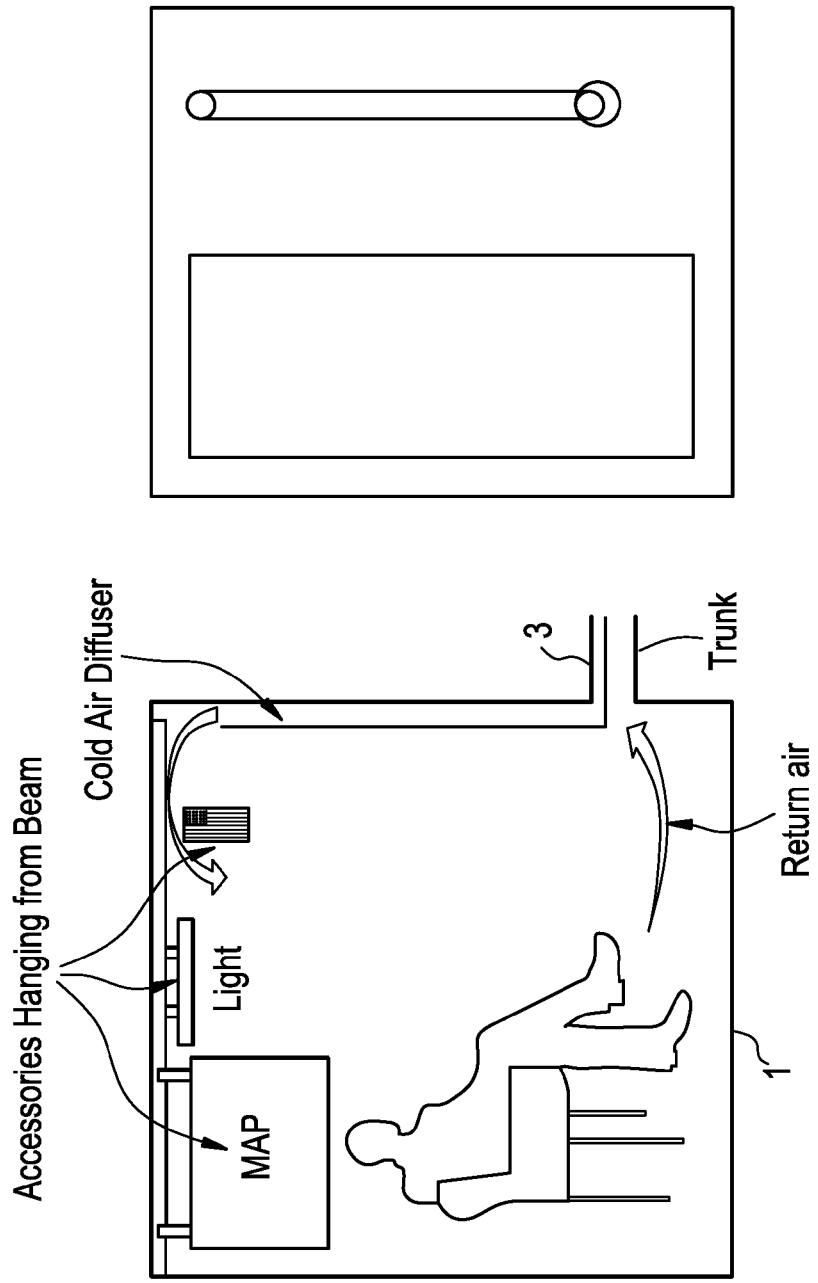

METHODS AND SYSTEMS FOR PROVIDING INFLATABLE LIGHTWEIGHT SHIELDED ENCLOSURES

RELATED APPLICATIONS

This application claims the benefit of priority from U.S. Provisional Applications No. 61/485,606 and 61/510,572 and incorporates by reference herein as if set forth in full herein, the disclosures of U.S. Provisional Application Nos. 61/485,606 and 61/510,572. This application is also related to, and incorporates by reference herein as if set forth in full herein, the disclosure of U.S. patent application Ser. No. 12/703,712 filed Feb. 10, 2010.

BACKGROUND OF THE INVENTION

Keeping communications secret from an adversary or competitor has long been the challenge of the military, agencies of the federal government as well companies that are targets of corporate espionage. The challenge becomes even more difficult when communications are made from locations that do not have structures that have been built to prevent eavesdropping and the like, such as when a member of the presidential cabinet, foreign service or military travels to a foreign country, works in an embassy built by some other country or travels to a locale within the United States that is not considered secure from a communications point of view. Further, when secret or secure communications are required on the battlefield or in battlefield-like conditions a secure structure may be difficult to construct.

Secure enclosures that protect against electromagnetic interference (EMI) and radio frequency interference (RF) have been in operation for more than fifty years. Originally these enclosures were made of rigid metal panels, beams and doors and were typically prefabricated and shipped to a site were they would require a number of skilled experts to erect. More recently, shielded tents that can be transported in cases and quickly erected were introduced. Still, these tents require the use of a metallic support structure (e.g. beams, etc.,), integrated power and signal filters, waveguide vents, environmental control units (e.g., blowers, air conditioners, heaters). These tents are also bulky and require many transport cases for shipment and deployment. Just the weight of the empty transportation cases for a typical 7×7×7 enclosure could be in excess of 100 lbs, while the total weight of the system could reach 300 lbs.

Even more recently, support frames made from rigid aluminum tubing which can be erected with simple tools, angle connectors and/or articulated tubing have been introduced. These frames work well but are still relatively heavy and require large transport cases to store the longest components. Further, even the most efficiently designed aluminum frame still requires multiple individuals to construct. Yet further to attach a tent-like, shielded material to such a frame requires reinforced attachment points sewn into a roof section and into the corners that form an enclosure. In order to avoid stressing the stitching of the shielding material, which creates small holes that reduce the attenuation of high frequencies, the shielded material is stitched into a strong outer shell, typically made of a nylon fabric. However, this outer shell or skin is heavy, making it difficult to fold and, thus, requiring a larger and heavier transport case or cases.

Waveguide vents (WGVs) and power and signal panels must be attached to, or otherwise formed within, the shielded material through which connections to external power, signal and air supply components are made. To do so, great care must be taken so as to assure electrical conductivity between the fabric making up the flexible, shielded material and the typically rigid material making up a panel. This connection is almost always a weak point due to the challenge of connecting a rigid material to a flexible one. Many times the weight of the vents or panel along with their associated components stretches the flexible fabric and creates a tear or a distortion. While the installation of reinforcement patches on the surface of the flexible fabric may reduce tearing the patches add weight and reduce the flexibility of the material making it difficult to fold.

Accordingly, it is desirable to provide extremely lightweight and secure enclosures that provide at least the same level of EMI/RF, Electromagnetic pulse (EMP) and infrared protection (i.e., attenuation) as existing enclosures, but overcome the problems associated with the existing enclosures.

SUMMARY OF EMBODIMENTS OF THE INVENTION

The present invention provides various embodiments for providing lightweight, inflatable enclosures including: an inflatable, lightweight shielded enclosure that comprises one or more inflatable, lightweight shielded beams arranged to support a shielded material; and an inflatable, lightweight shielded connection system for connection to a control system. The connection system may comprise one or more inflatable, lightweight shielded connecting trunks for connecting the control system, or one inflatable, lightweight shielded connecting trunk for connecting the control system. In either case, connecting trunk may comprise a conductive Radio Frequency (RF) fabric.

In other embodiments: the single trunk may comprise an inner tube, and an outer tube connected to the inner tube; the enclosure may further comprise means for accessing the inside of the enclosure, such as a door, for example and/or a gaseous inflation device for inflating the inflatable, shielded beams; the enclosure may include a connectable, ballistic, nylon cover.

In an embodiments of the invention the enclosure may have a weight of approximately twenty-one pounds.

Yet further, the shielded material referred to above may comprise two layers of a shielded, attenuating fabric providing an attenuation of 70 dB to 80 dB of attenuation of a 1 GHz signal, for example.

The invention further provides methodical embodiments for providing an enclosure comprising: arranging one or more inflatable, lightweight shielded beams to support a shielded material; and connecting an inflatable, lightweight shielded connection system to a control system. In another embodiment a method may further comprise connecting one or more inflatable, lightweight shielded connecting trunks to the control system, or connecting one inflatable, lightweight shielded connecting trunk to the control system.

BRIEF DESCRIPTION OF THE DRAWINGS

FIG. 3 depicts a connection system according to an embodiment of the invention.

FIGS. 4-8 depict shapes of a system according to embodiments of the invention.

FIGS. 11 and 12 depict exemplary cross-sectional views of beams used in embodiments of the invention.

FIG. 13 depicts an exemplary support located at a corner in an embodiment of the invention.

FIGS. 14a through 20 depict connection systems according to embodiments of the invention.

FIG. 21 depicts an exemplary circulation pattern, among other features, of a system provided by the invention.

DETAILED DESCRIPTION OF THE INVENTION, WITH EXAMPLES

Figure 1:
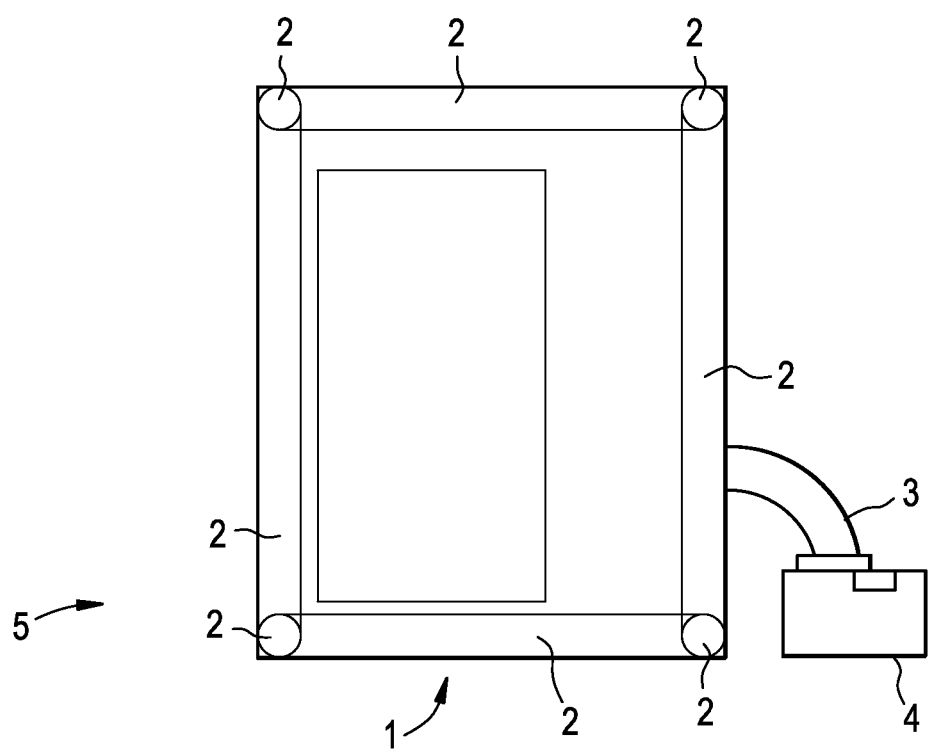
FIG. 1 depicts a system according one embodiment of the present invention.
Figure 2:
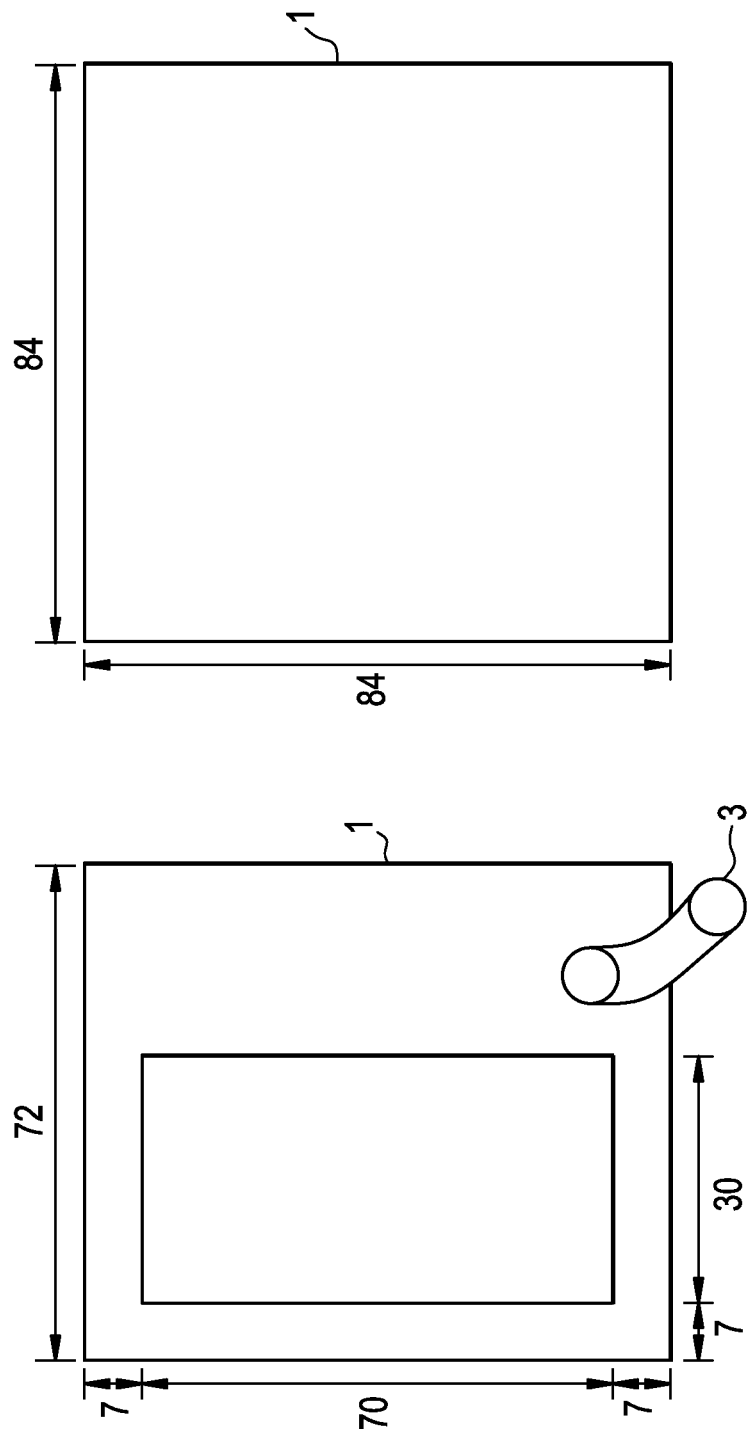
FIG. 2 depicts exemplary dimensions of a system according to an embodiment of the invention.
Figure 4:
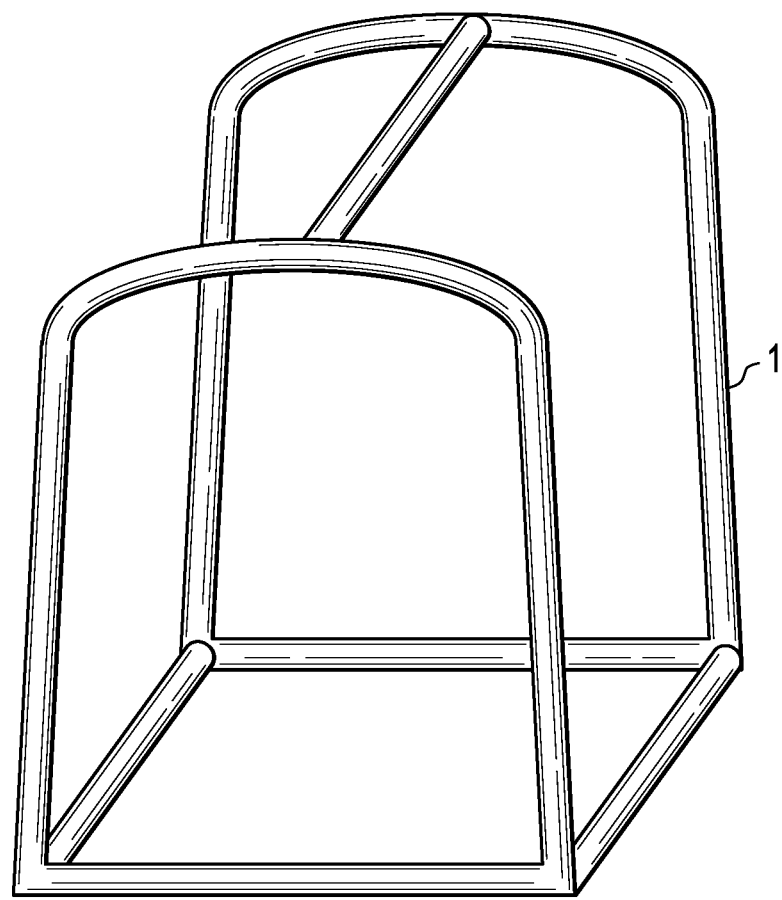
Figure 5:
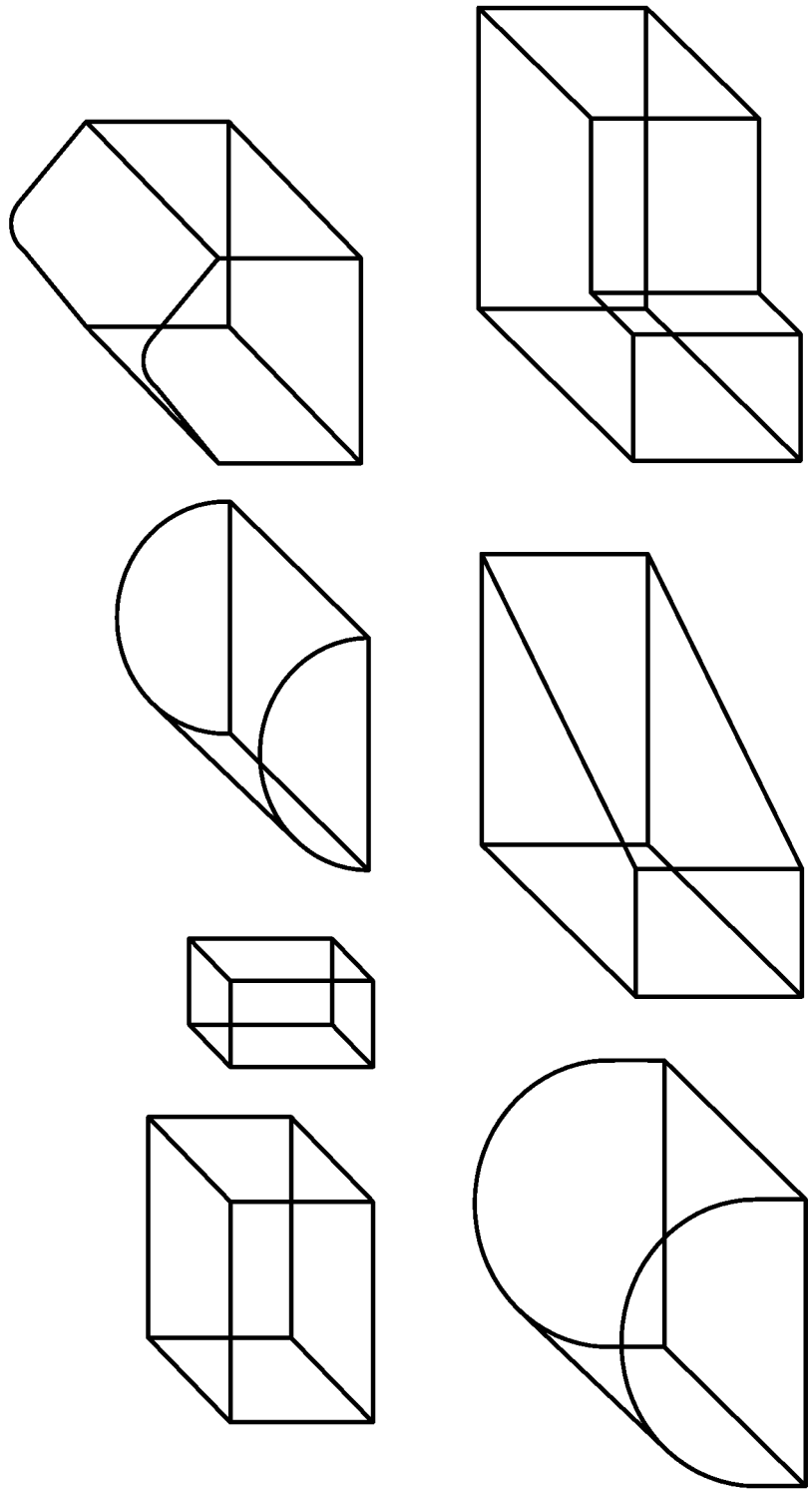
Figure 7:
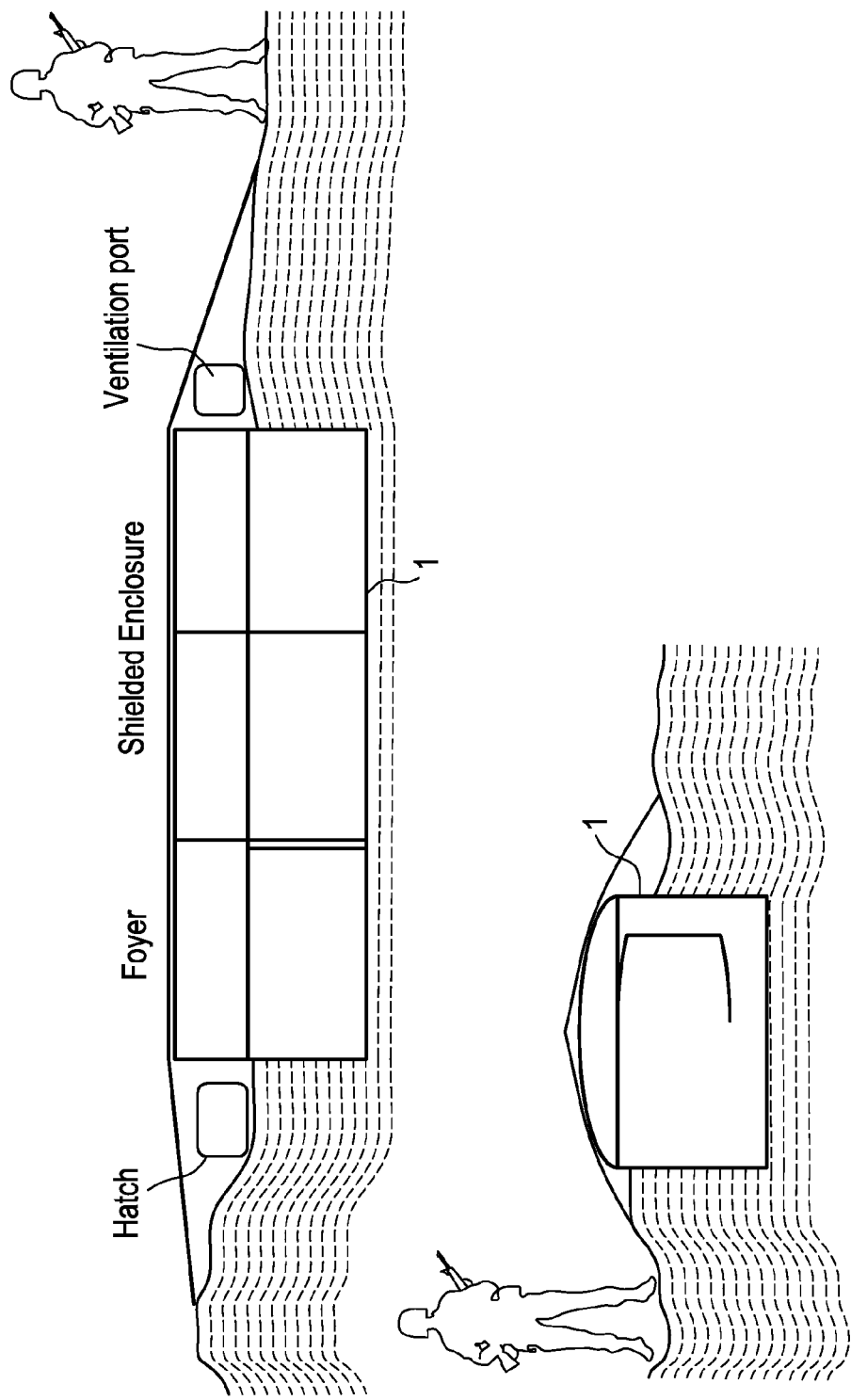
Figure 8:
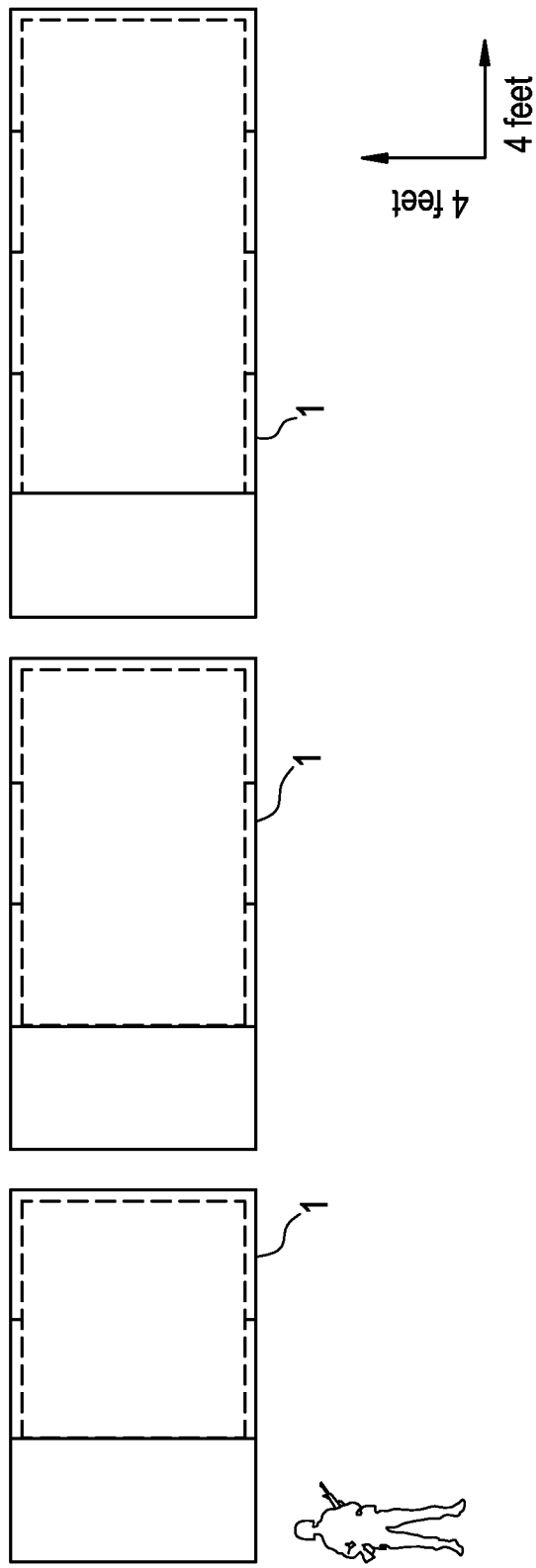

Referring now to FIG. 1, there is shown a system 5 that includes an inflatable, lightweight shielded enclosure 1 according to an embodiment of the invention. The enclosure 1 consists of one or more inflatable, shielded beams 2 that are arranged as a support structure to support a shielded material 6 (see FIG. 3). It should be understood that, for the sake of simplicity, the shielded material is not shown in many of the Figures. Nonetheless each of the embodiments of the enclosures discussed herein may include shielded material placed over, or in contact with (in case the support beams are placed on the outside of the material), the shielded beams 2. The system 5 further includes an inflatable, shielded connection system 3 that may include one or more inflatable, shielded connecting trunks for connecting the enclosure 1 to a power, signal and air circulation control system 4. FIG. 2 depicts exemplary dimensions of an inflatable, rectangular enclosure 1 according to an embodiment of the invention. It should be understood that the dimensions shown in FIG. 2, as well as the dimensions shown in all of the Figures herein, are exemplary, and may be changed to fit a specific application/use/environment. For example, FIGS. 4-8 depict various additional shapes of inflatable, shielded enclosures 1 provided by the present invention. Yet further, though not shown in the Figures in order to simplify the following explanation it should be understood that each of the enclosures 1 shown in the Figures herein may include a door or another means of accessing the inside of the enclosures 1.

Referring now to FIG. 3 there is depicted an inflatable, shielded enclosure 1 that includes a plurality of inflatable, shielded beams 2 that are connected to provide a frame or structure to support a shielded material 6. The inflatable, shielded beams 2 may be inflated by any number of known air or gaseous inflation devices (not shown) that may be a part of the control system 4 or powered by the system 4 shown in FIG. 1.

Figure 9:
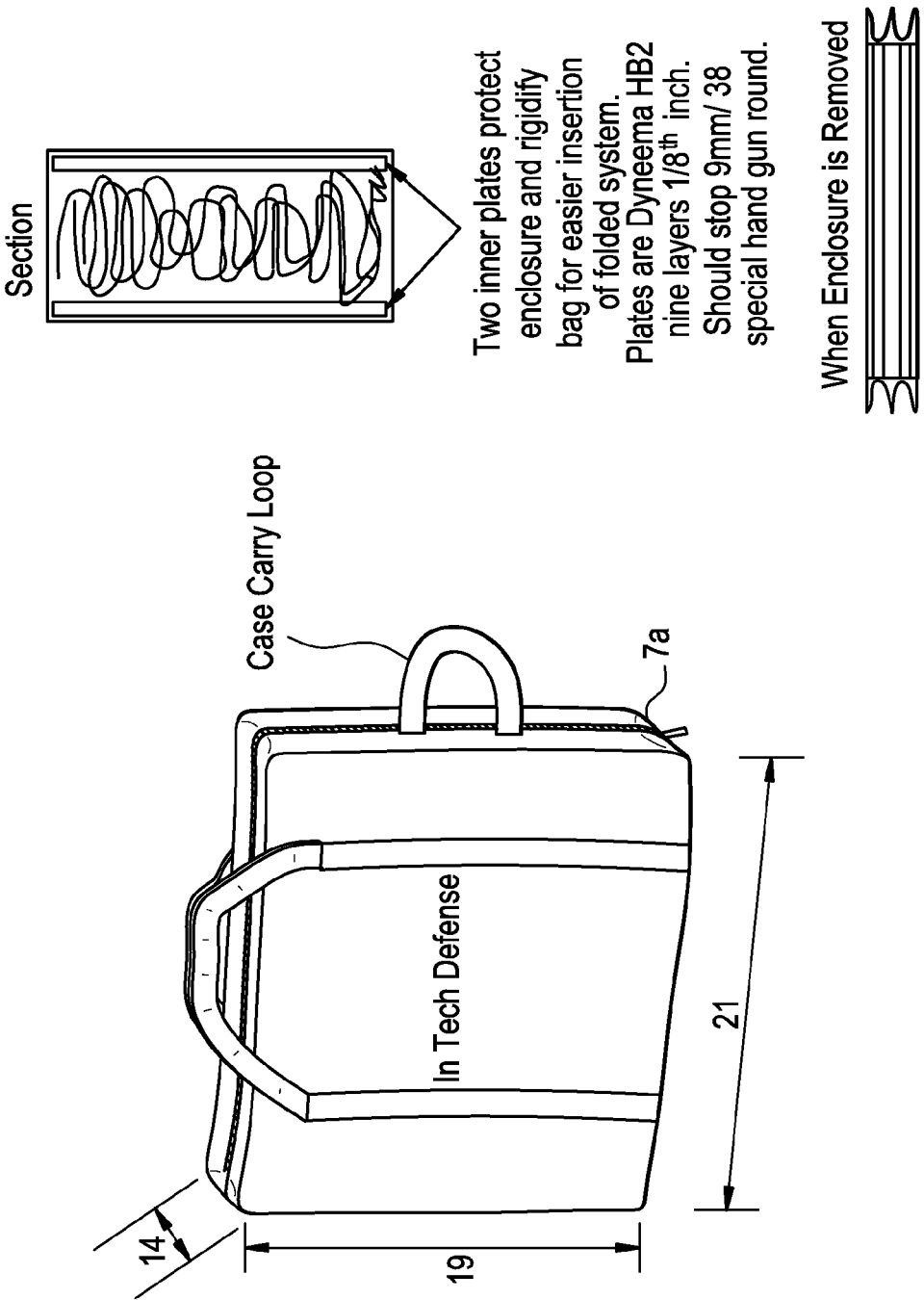
FIGS. 9 and 10 depict carrying cases according to embodiments of the invention.
Figure 10:
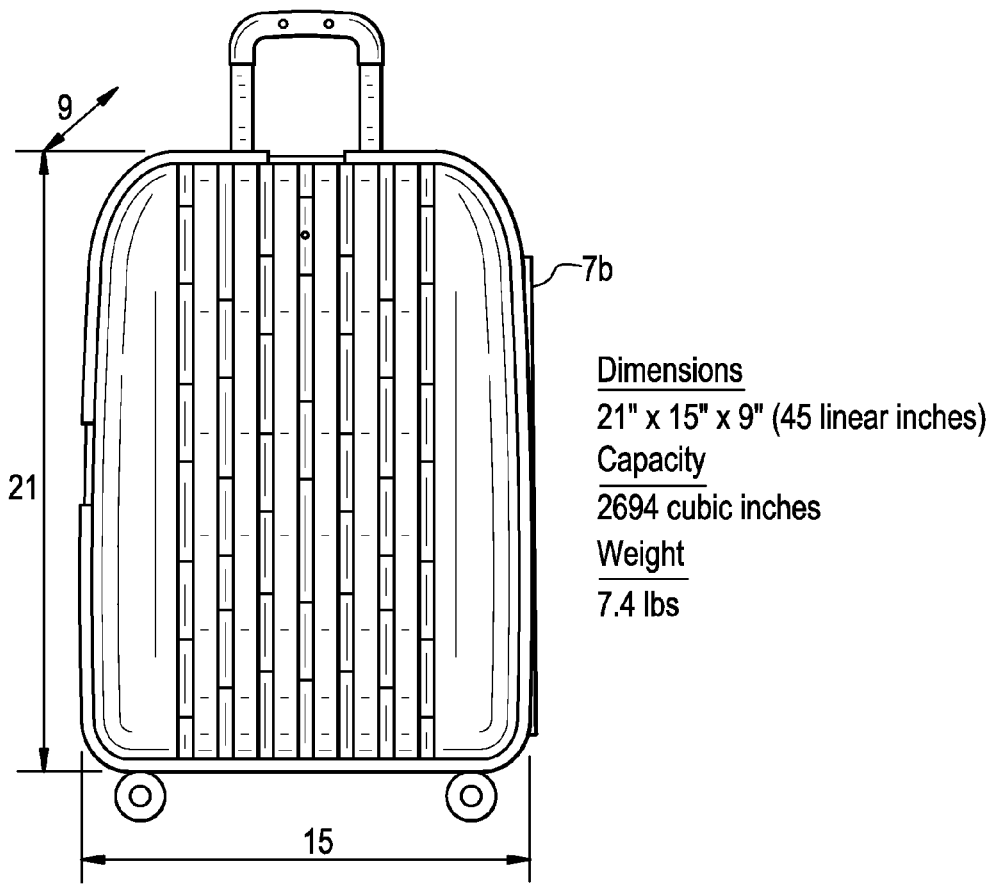

Because the shielded enclosures 1 provided by the present invention are made using inflatable, shielded beams they are very lightweight compared with traditional tent-like enclosures which typically require the use of metal, wood, carbon-based or aluminum beams. Further, because the devices and components required to provide power, signaling (e.g., communications) and their associated support panels are placed in a separate control system 4 the enclosures provided by the present invention are ultra lightweight. In one embodiment of the invention a typical inflatable, shielded enclosure 1, including a "soft" cover carrying case 7a (see FIG. 9) may weigh approximately twenty-one pounds. Alternatively, an inflatable, shielded enclosure 1 provided by the present invention may be carried within a "hard" cover, wheeled carrying case 7b (see FIG. 10) which increases the weight by approximately seven and one half pounds.

Regarding the shielded material that is placed over, or in contact with, the inflatable beams 2, in one embodiment of the invention this material may consist of two layers of a shielded fabric that results in the attenuation of EMI, RF, EMP and/or infrared signals (e.g. 70 dB to 80 dB of attenuation of a 1 GHz signal). In an embodiment of the invention, an additional "ballistic", nylon cover that is used in many traditional tent-like shielded enclosures is not a part of the shielded material 6.

Figure 11:
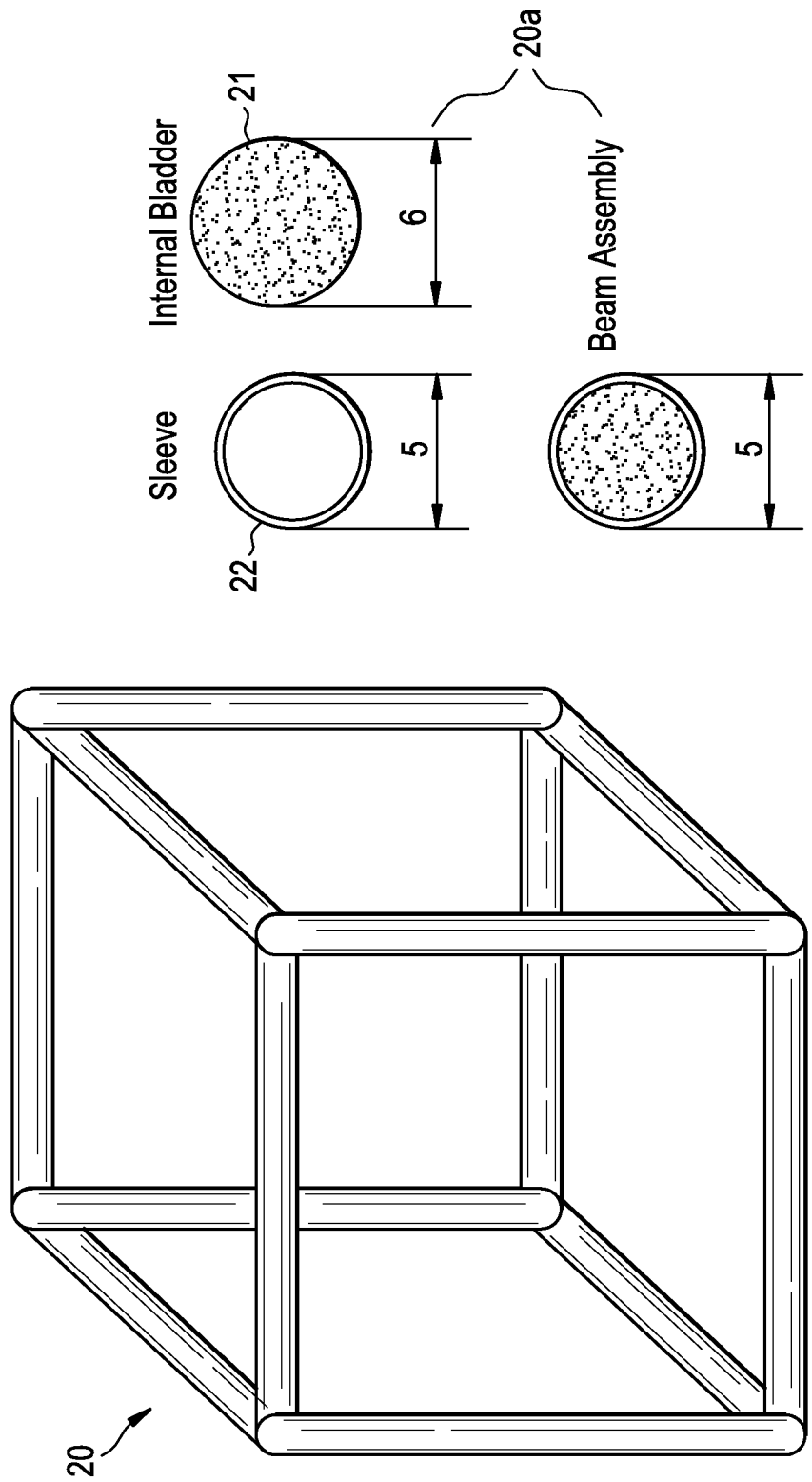

As illustrated in FIGS. 1-8, the inflatable structures 1 may take the form of many different shapes and sizes. So too the inflatable, shielded beams 2 may take the form of many different shapes and sizes. Referring to FIGS. 11 and 12 there are depicted "skeletal" inflatable, shielded beam structures or frames 20 and 200, respectively. As shown the structures 20, 200 may include a number of individual beams connected together. FIGS. 11 and 12 also depict some cross-sectional views 20a, 200a of individual beams provided by the present invention. Though the cross-sectional views 20a, 200a depict circular cross-sections it should be understood that the beams provided by the present invention may have various other cross-sectional shapes and dimensions, such as rectangular, triangular, hexagonal, etc., to name just a few examples. Again, as noted above, the cross-sectional dimensions of the inflatable, shielded beams 20a, 200a shown in FIGS. 11 and 12 are exemplary and may be varied to satisfy a given enclosure shape, size, application, use and/or environment. In an embodiment of the invention the shielded fabric making up the outside skin of a beam made be made from various materials that are selected, for example, based on whether the overall enclosure 1 is to be used inside another structure (e.g., building) or outside. If the structure is to be used outside the shielded fabric may be additionally suited to withstand weather conditions such as rain, snow, wind and various temperature ranges. In one embodiment of the invention, when the enclosure is used inside another structure the internal pressure that a beam 2 may be inflated to may be 4.5 psi. In an alternative embodiment of the invention, when the enclosure 1 is used outside the internal pressures that a beam may be inflated to may be greater than 4.5 psi depending on the characteristics of the shielded fabric and the characteristics and design of the internal structure (e.g. bladder) of such a beam.

FIGS. 11 and 12 depict internal bladder sections 21, 201 of an individual beam 20a, 200a. In accordance with an embodiment of the invention each individual beam 20a, 200a includes a bladder section 21, 201 and an outer shielded section 22, 202 surrounding the bladder section 21, 201. In accordance with an embodiment of the invention, upon inflation of a bladder section 21, 201 such a section expands and makes contact with an outer section 22, 202. If required for additional stability, beams 2 making up an enclosure 1 provided by the present invention may be connected using a flexible or rigid corner section 8 as shown in FIG. 13. Additional features and embodiments of bladders provided by the present invention are set forth in FIG. 3.

Referring now to FIGS. 14a through 20, there is shown various connection systems 3 in accordance with various, exemplary embodiments of the invention. In FIGS. 14 and 14b, a so-called "single" trunk connection system 3 is depicted. As shown, the connection system 3 includes a single, inflatable, shielded trunk 3 for connecting the inflatable, shielded enclosure 1 to the control system 4. In one embodiment of the invention the trunk 3 may be made from a conductive RF fabric. The trunk 3 may be securely connected to the control system 4 at point 9a using magnets, conductive velcro strips or other means that securely connects the trunk 3 to the control system 4 without degrading the shielding characteristics of the system 5 (e.g., no leakage of signals). On the opposite end, the trunk 3 may be sewn or otherwise connected to the fabric making up the shielded material 6 or another part of the enclosure 1 at point 9b.

Figure 15A:
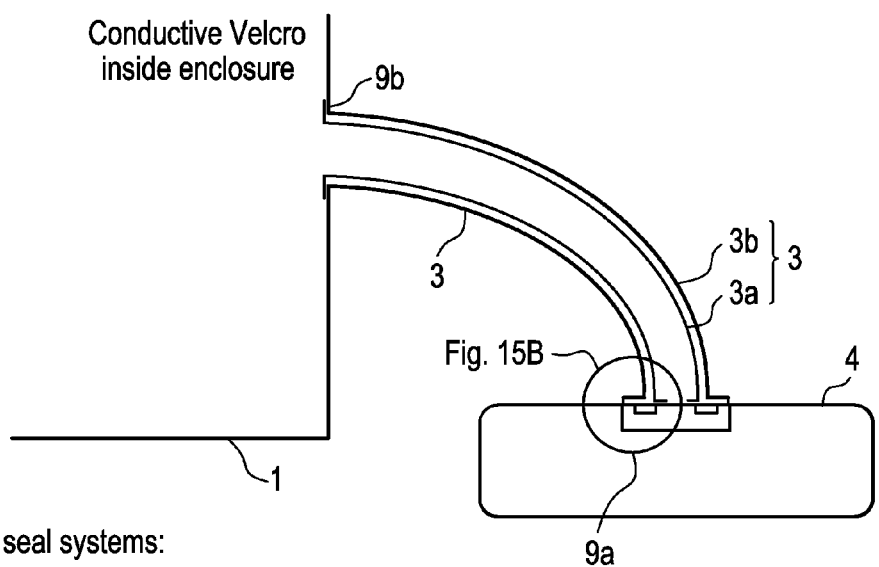
Figure 15B:
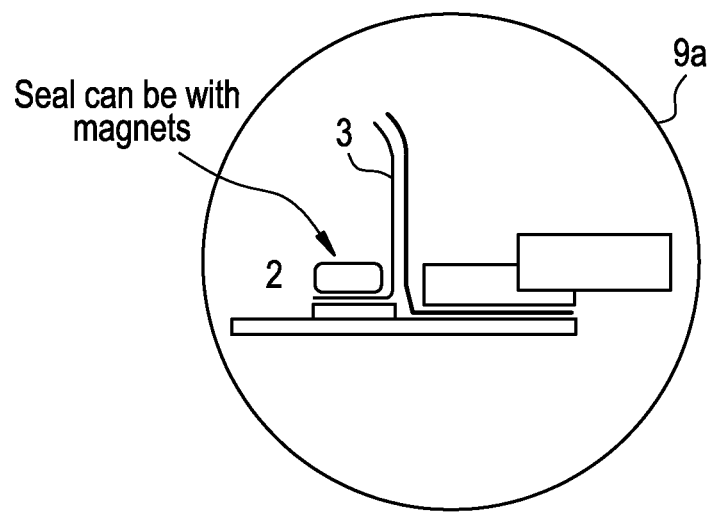
Figure 15C:
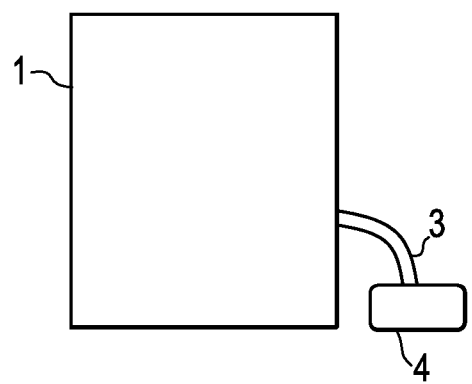

Referring now to FIGS. 15a through c there is shown a so-called "double" trunk connection system 3. As shown, the connection system 3 includes an inner trunk 3a and an outer trunk 3b. In an embodiment of the invention both trunks 3a and 3b may comprise a conductive, RF shielded fabric. In one embodiment of the invention, the outer trunk 3b may be secured to the control system 4 at point 9a using magnets or conductive velcro while both trunks 3a, 3b may be connected to the shielded material 6 or another part of the enclosure 1 at point 9b using conductive velcro, for example. In accordance with an embodiment of the invention, upon inflating the inner trunk 3a the inner trunk 3a expands and makes contact with the outer trunk 3b creating a secure seal (see also FIGS. 17a and b and 18a and b). In one embodiment of the invention the cross-sectional diameter of the inner trunk 3a is larger than the cross-sectional diameter of the outer trunk 3b adding to the formation of the secure seal. As shown, the trunks may be concentric, parallel or concentric and parallel.

Figure 16A:
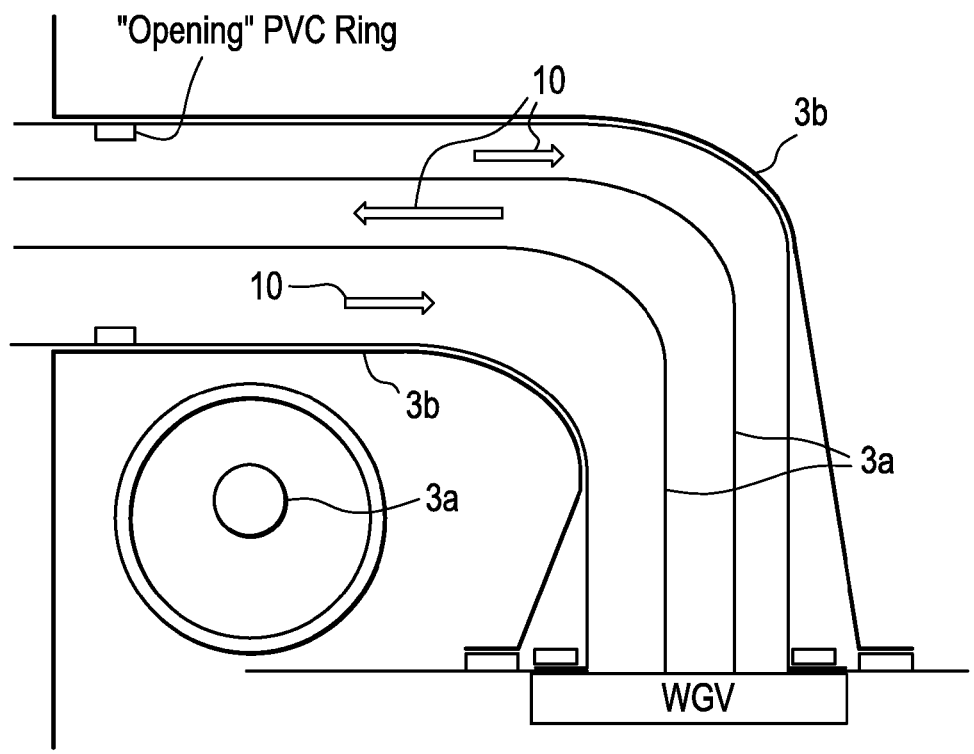
Figure 16B:
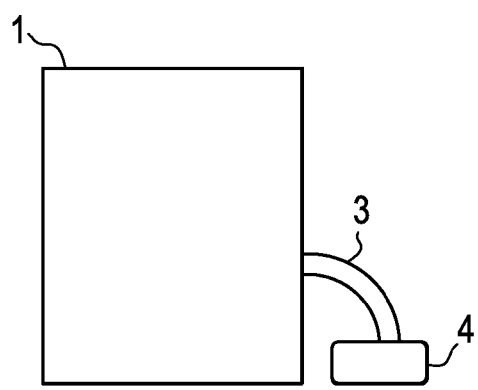
Figure 18A:
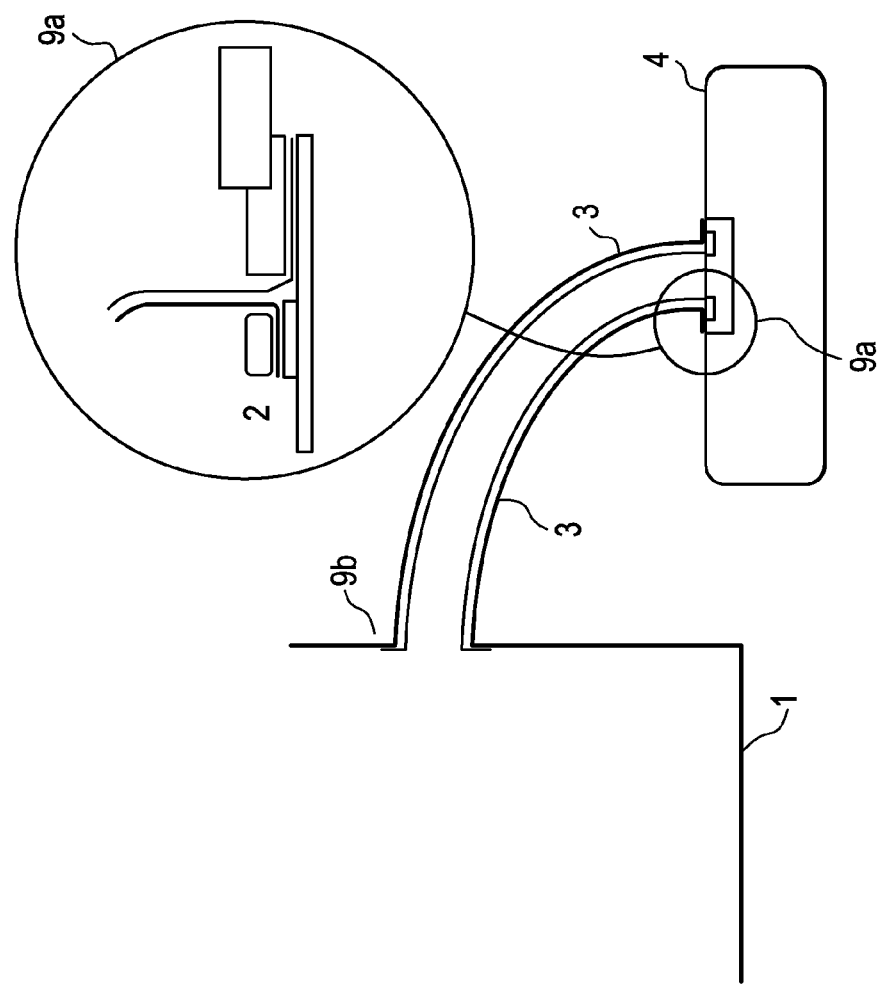
Figure 18B:
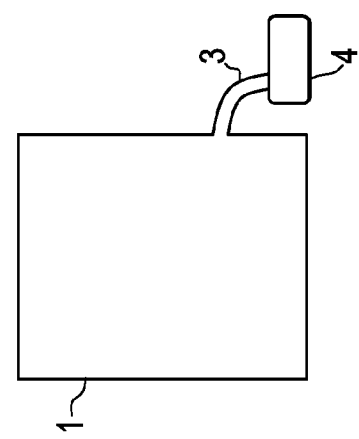

FIGS. 16a and b depict exemplary air flows between the enclosure 1 and control system 4 via connection system 3. In an embodiment of the invention, once the control system 4 is connected to the enclosure 1 via the connection system 3 air may be circulated through the system 5 using fans, blowers, filters and associated circulatory components that may be made a part of the system 4. The direction of air flow in the system 5 is depicted by the arrows 10 in FIG. 16a.

Figure 19:
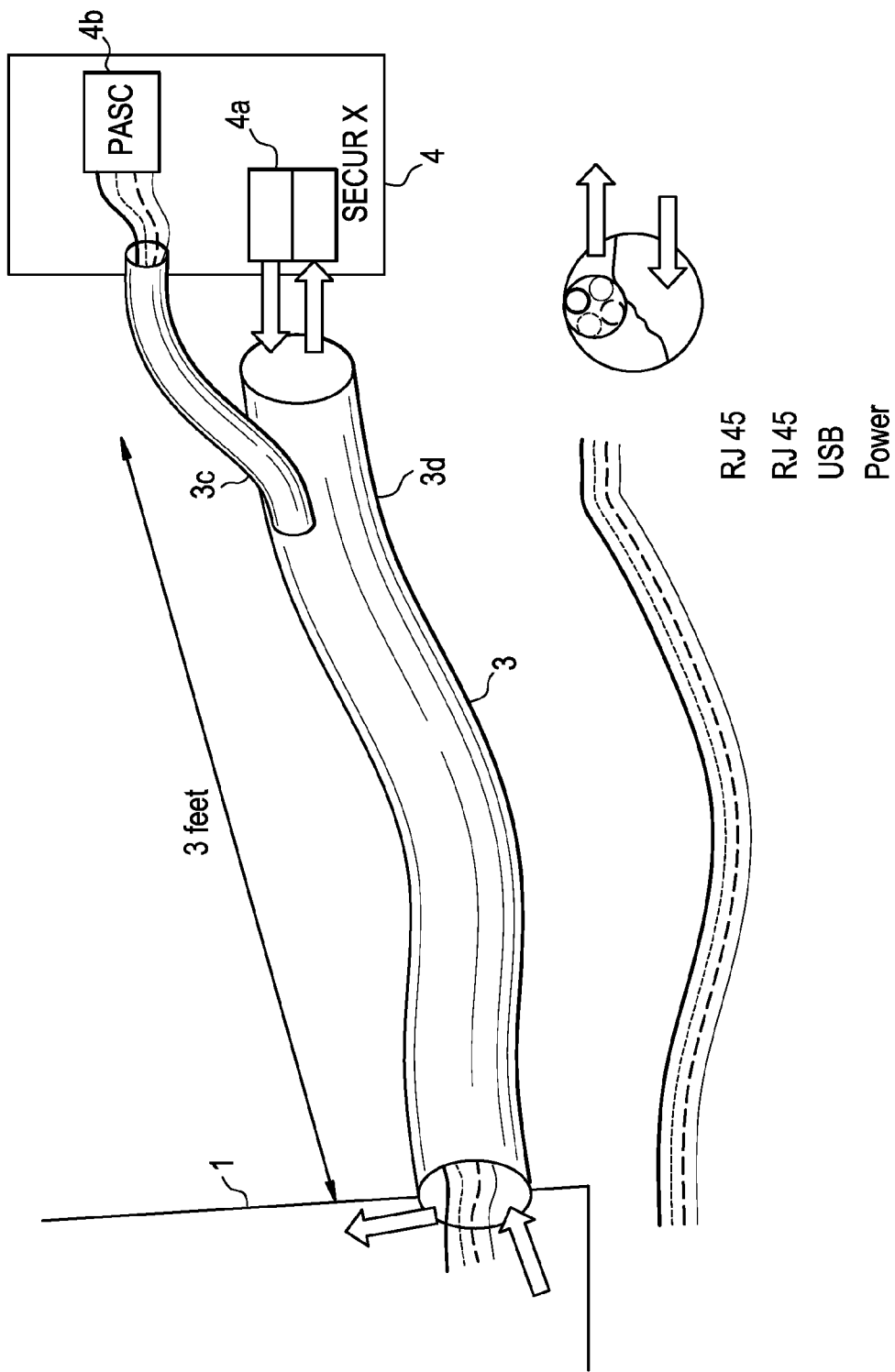

Referring now to FIG. 19 there is shown another exemplary connection system 3 according to yet another embodiment of the invention. As shown the system 3 may include a branched trunk 3 which is made up of multiple branches 3c and 3d. In the embodiment depicted in FIG. 19 the number of branches is two. However, it should be understood that additional embodiments of the invention may include more than two branches. As shown in the exemplary embodiment in FIG. 19, a first branch 3d is connected to a first section 4a of the control system 4 while a second branch 3c is connected to a second section 4b of the control system 4. In exemplary embodiments of the invention the first section may comprise air flow components or secure telecommunications components while the second section 4b may comprise power and signaling control ("PASC") components, or vice-versa.

FIGS. 22-29 depict various, exemplary configurations of the system 4, components that may be a part of an exemplary system 4, along with typical air flows through, or caused by, the components making up system 4 in conjunction with the connection system 3 and enclosure 1. Typical components making up an exemplary system are PASC components, WGV components, air generation and circulation components (e.g. fans, blowers) and various indicators, switches and displays. To repeat, the specifications (weights, dimensions, operating characteristics) shown in FIGS. 22-28 are exemplary and may vary depending on the design of a given system 5.

Figure 30:
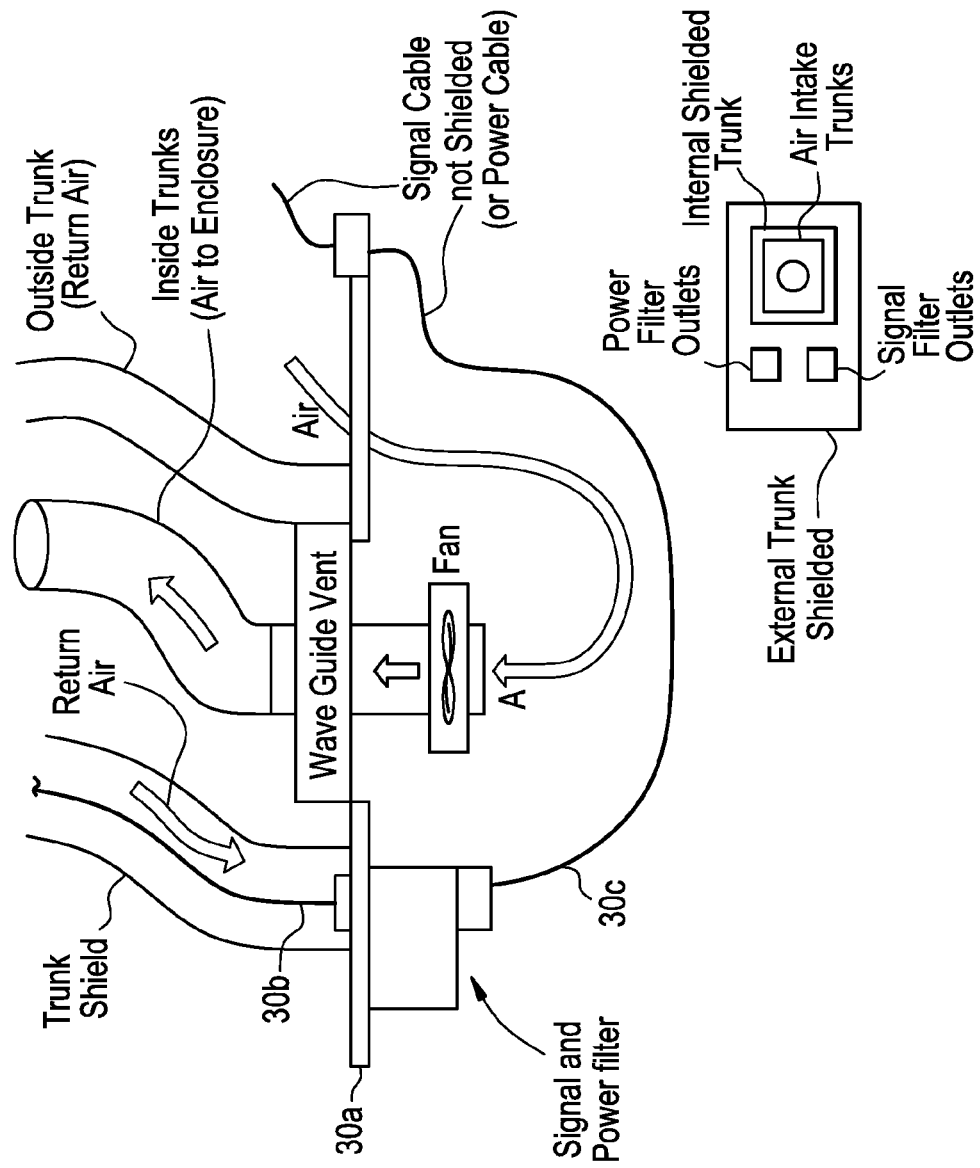
FIG. 30 depicts a side view of an exemplary embodiment of the invention.

FIG. 30 depicts an embodiment where power and signal filters may independent of each other, instead of combined in a PASC, and next to a waveguide vent. One side of the filters is within the enclosure trunk system 3b. The other side is outside the trunk 3. As represented in FIG. 30, a signal and/or power filter 30d is located below the aluminum mounting plate 30e. The filtered power and/or signal is represented by pathway 30b and goes inside the trunk inside the enclosure while another unshielded cable 30c goes to the outside.

Still further, It should be understood that any number of other components may be included within control system 4, such as filters and other electronic, mechanical, optical, electrical components (to name just a few examples). As used herein the word "filter" may mean a single filter, such as an RF power or signal (analog or digital) filter, or one made of several components assembled in one or more cavities separated by bulkhead(s) (see for example, the figures in U.S. patent application Ser. No. 12/703,712), or a circuit board that includes filtering components, or a final assembly. In accordance with embodiments of the invention, a filter may be connected to either copper or optical fiber transmission lines/harnesses. Yet further, a filter may include optical fiber, optical components, optical-to-electrical components, and/or electrical-to-optical components. Though referred to in the singular, it should be understood that a filter that is made a part of system 4 may comprise one or more components. In a further embodiment of the invention, when optical fiber is used to carry communication signals and the like into the enclosure 1 one or more additional components may be added to the system 4 or made a part of a filter to allow for the transmission, filtering and/or conversion, if needed, of optical signals to electrical signals (O/E) and, if needed, conversion back from electrical signals to optical signals (E/O). In the case where no O/E or E/O conversions are necessary, a filter and any additional component may be all optical components. Yet further, analog/digital optical converters, as well as passive and active optical components may be added to the system 4 or made a part of a filter as required.

Figure 29:
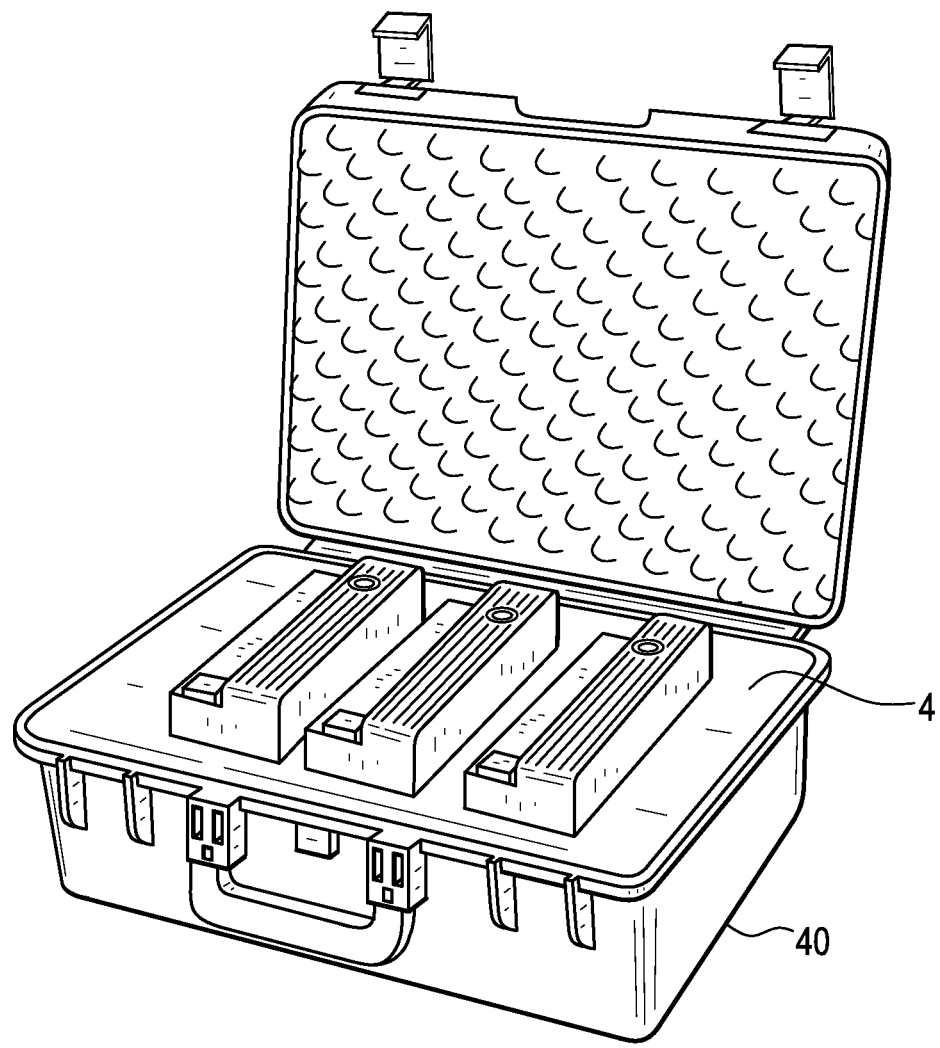

FIG. 29 depicts an exemplary example of an enclosure 40 that may be used to protect system 4. The enclosure 40 may be portable so that it may be carried along with the enclosure 1 and its carrying case 7a (see FIG. 9) by a single individual.

Figure 20A:
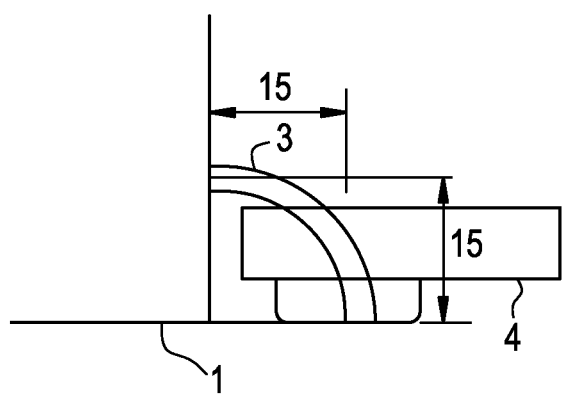
Figure 20B:
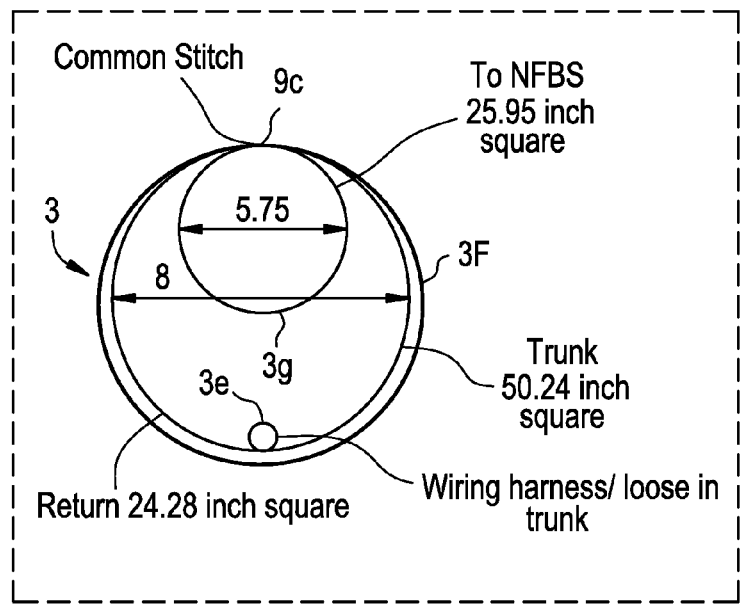
Figure 20C:
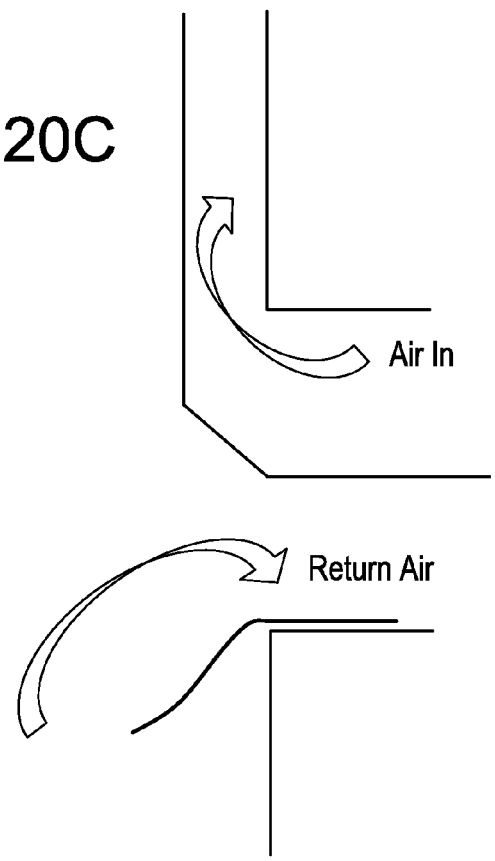
Figure 22:
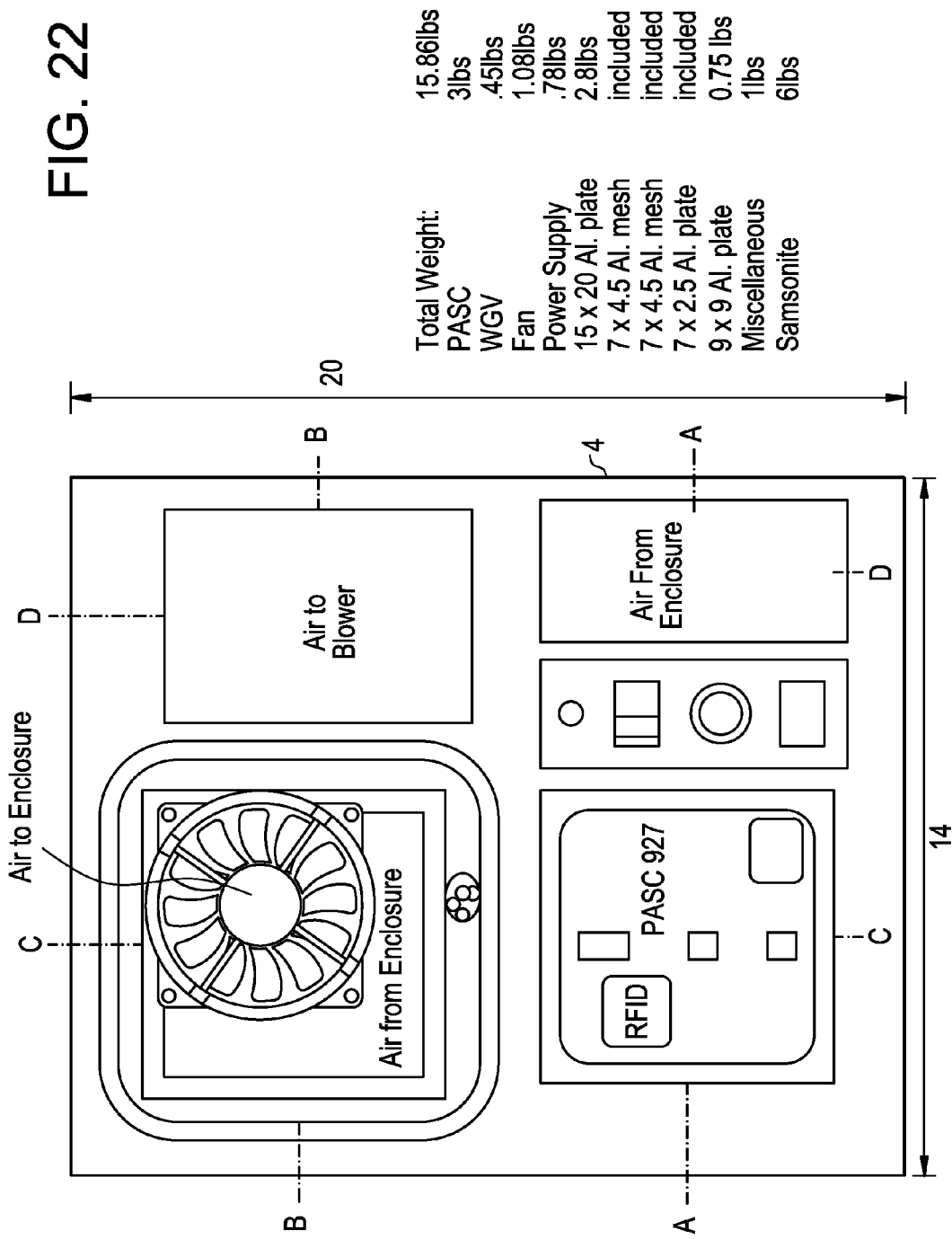
FIGS. 22-29 depict exemplary configurations and components of systems in accordance with embodiments of the invention.
Figure 23:
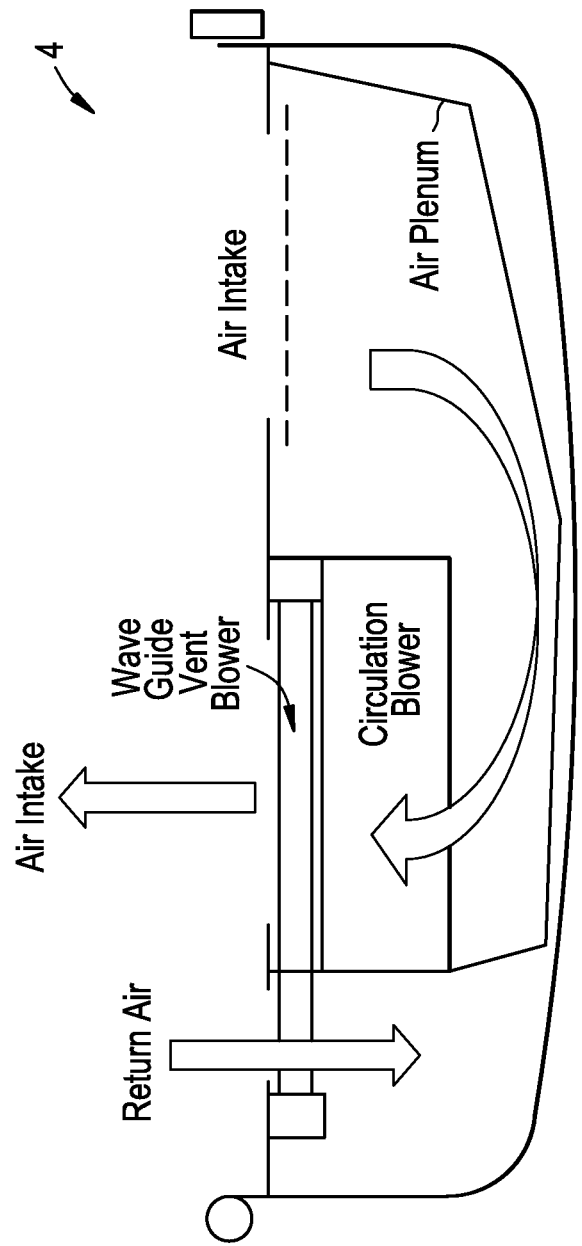
Figure 24:
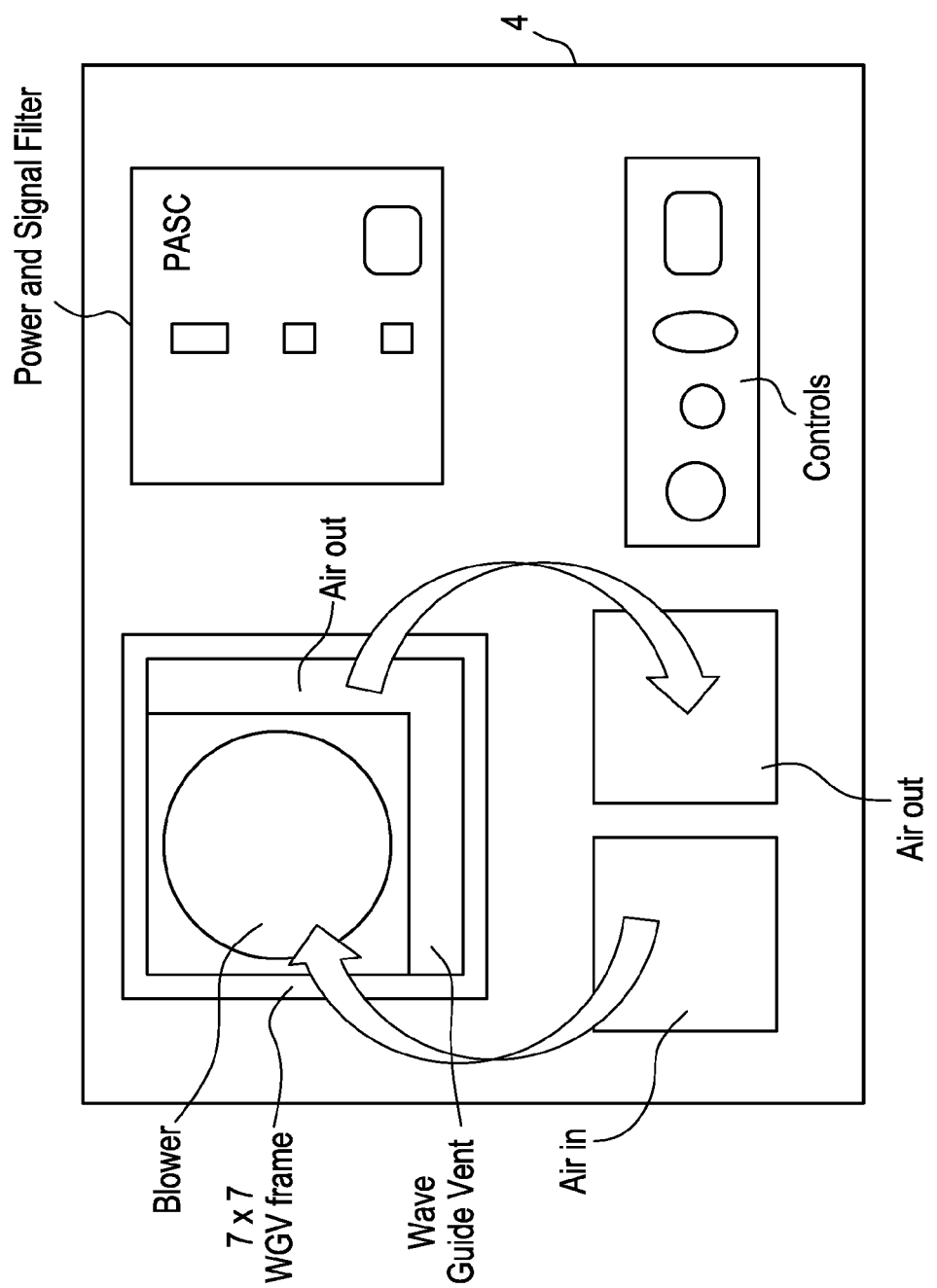
Figure 25:
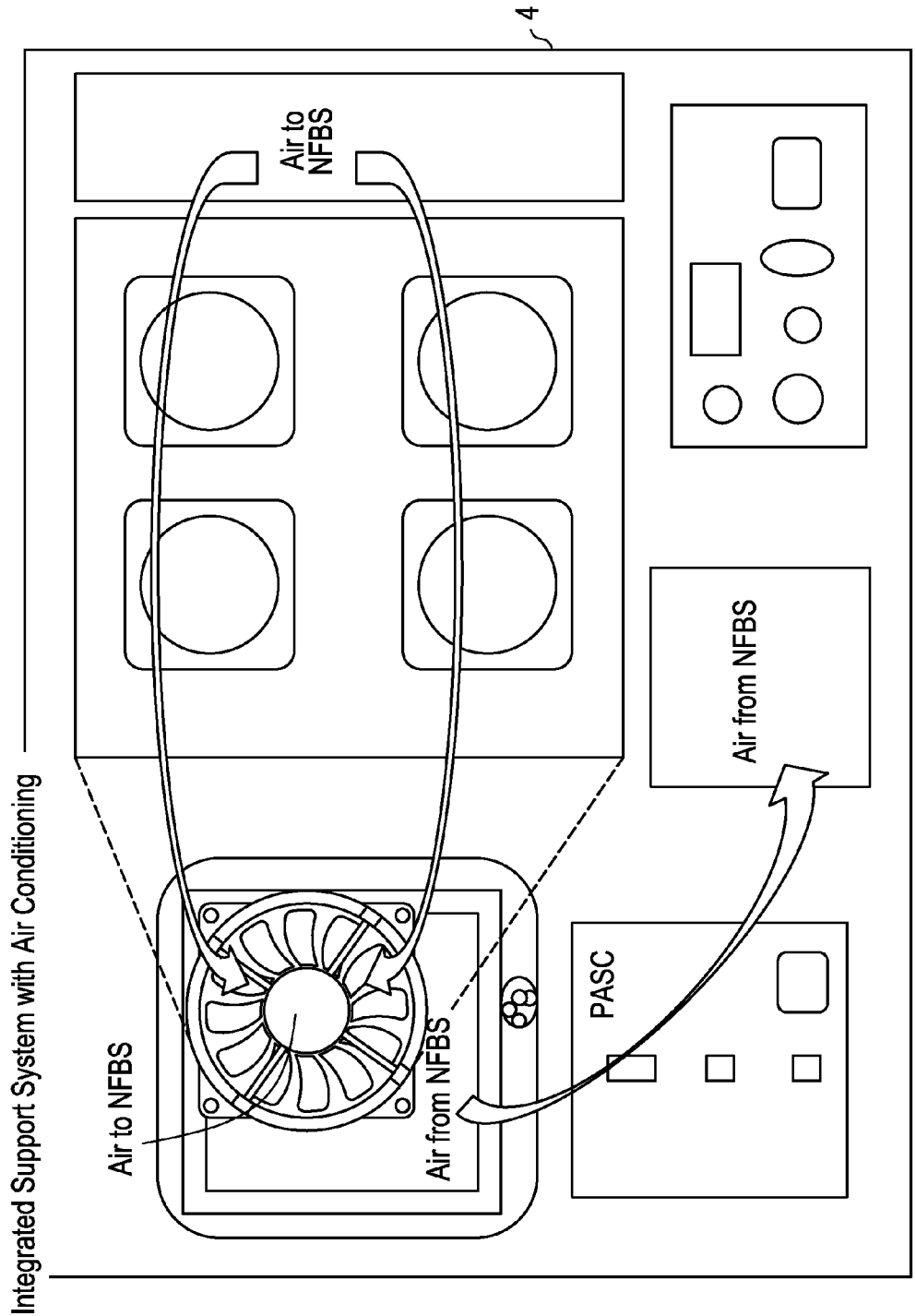
Figure 26:
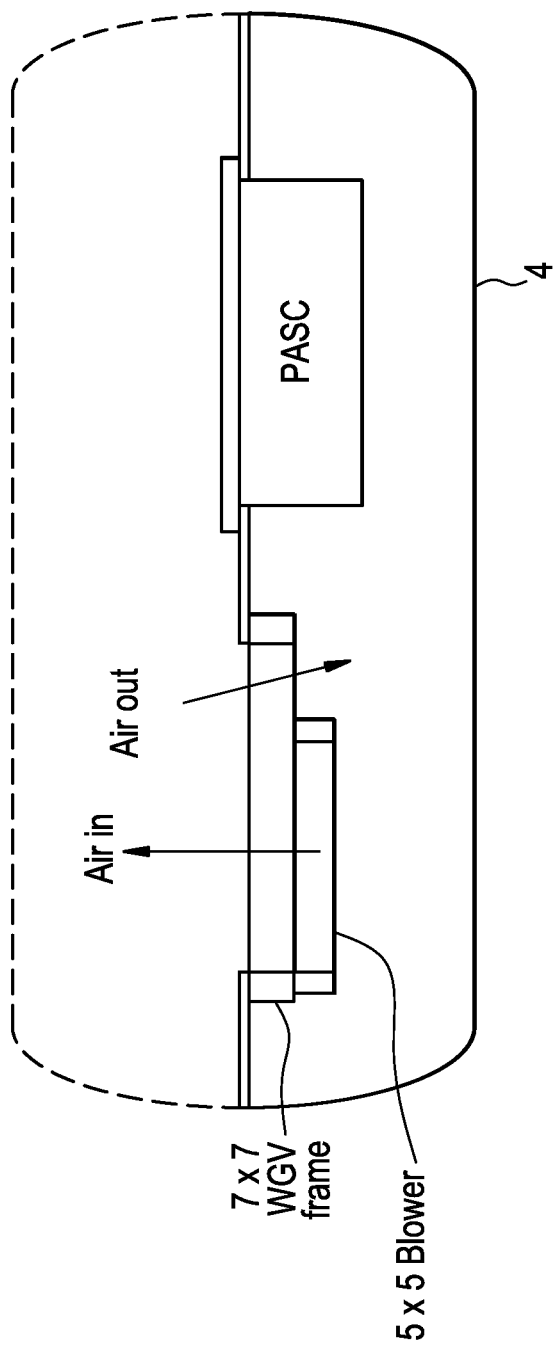
Figure 27:
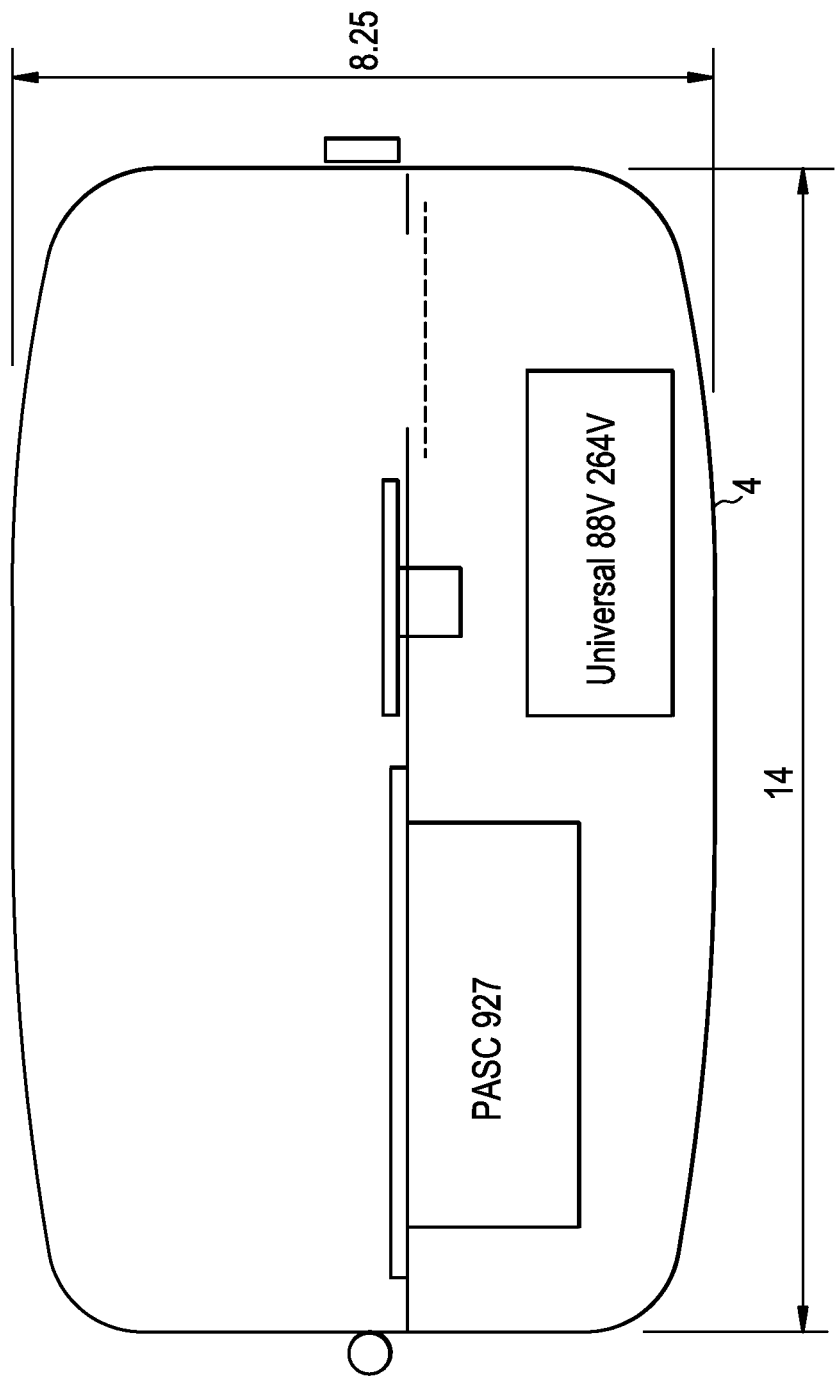
Figure 28:
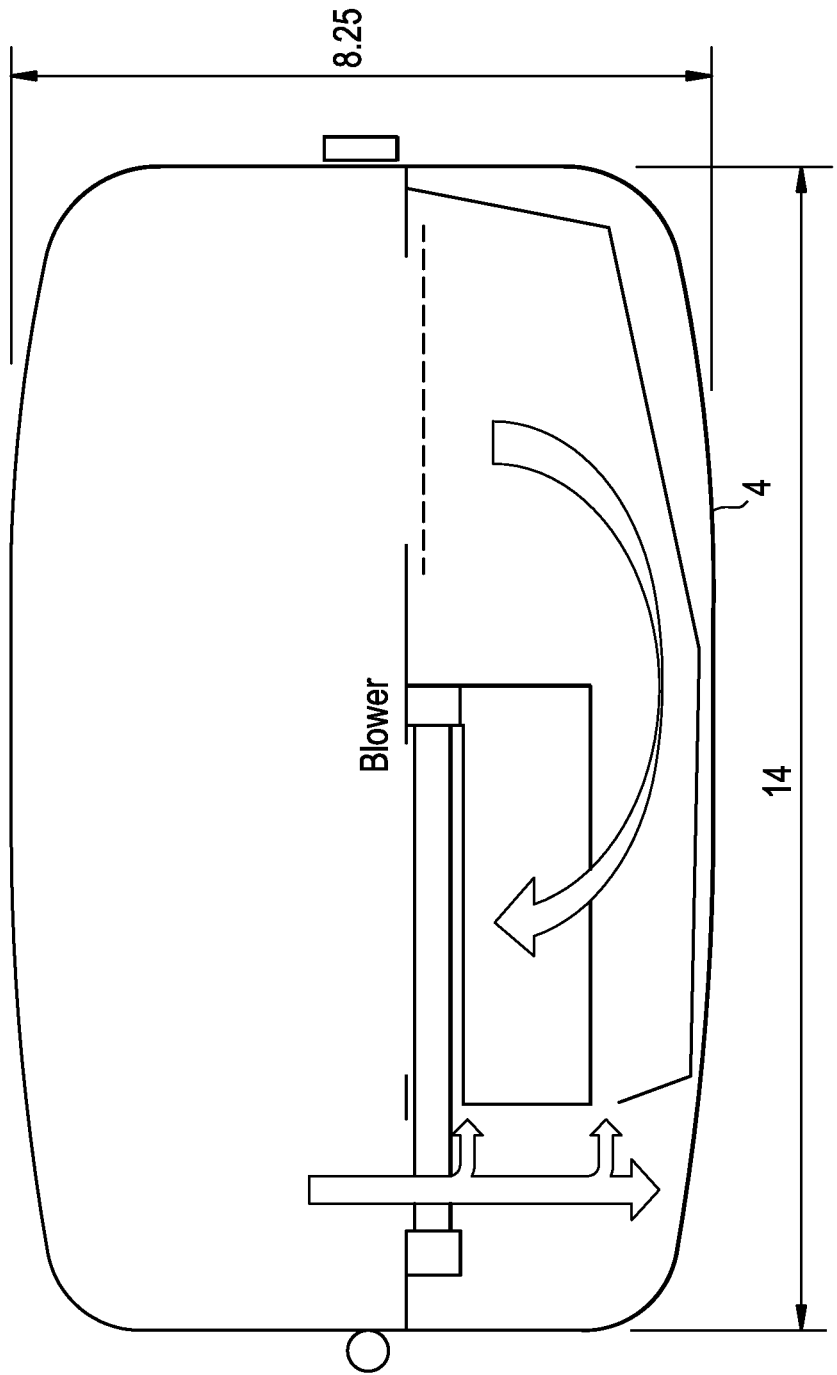

Referring now to FIGS. 20a through c there is shown a somewhat, more detailed depiction of a single trunk connection system 3 in accordance with an embodiment of the invention. As shown in FIG. 20b, the single trunk, inflatable and shielded connection system 3 includes an inner tube 3g connected to an outer tube 3f using one or more stitches at position 9c. Also shown is wiring harness 3e which, for example, may comprise electrical and/or optical wires, cables, for example. FIG. 20c depicts exemplary air flow through the inner and outer trunks. In one embodiment of the invention, air flows in one direction through outer tube 3f (e.g., into the enclosure 1) and in the opposite direction through inner tube 3g (e.g., out of the enclosure 1). In the case where a double trunk connection system 3 is utilized, air flows in opposite directions, for example, through the inner and outer 3b trunks 3a, 3b.

FIG. 21 depicts an exemplary constructed inflatable, shielded enclosure 1 according to an embodiment of the invention. The embodiment in FIG. 21 illustrates a typically air flow/circulation pattern in the enclosure 1 as well as additional features of the present invention, for example, the ability to attach fixtures and removable items to the beams of the enclosure 1 (e.g., maps, lights, etc. . . . ).

The description above provides some examples of the scope of the present invention. It is not intended to be an exhaustive description of the many examples of the invention. Such a description would be impractical to write.

Variations of the examples given within are considered to be within the scope of the present invention.

We claim:

1. A lightweight shielded enclosure comprising:
   one or more inflatable, lightweight beams arranged to support a shielded material; and
   a pressurized, lightweight shielded connection system comprising at least one pressurized, lightweight shielded connecting trunk for connection of the lightweight shielded enclosure to a control system, the at least one trunk comprises an inner trunk and an outer trunk, wherein at least one of said inner trunk or outer trunk is configured for air flow in one direction into the enclosure and wherein at least the other trunk is configured for air flow in an opposite direction.

2. The enclosure as in claim 1 wherein the at least one trunk comprises concentric trunks.

3. The enclosure as in claim 1 wherein the at least one connecting trunk comprise a conductive Radio Frequency (RF) fabric.

4. The enclosure as in claim 1, wherein the at least one trunk comprises:
   an inner tube, and
   an outer tube connected to the inner tube.

5. The enclosure as in claim 1 further comprising means for accessing the inside of the enclosure.

6. The enclosure as in claim 5 wherein the means for accessing the enclosure comprises a door.

7. The enclosure as in claim 1, further comprising a gaseous inflation device for inflating the inflatable, shielded beams.

8. The enclosure as in claim 1 wherein the enclosure has a weight of approximately twenty-one pounds.

9. The enclosure as in claim 1 wherein the shielded material comprises two layers of a shielded, attenuating fabric.

10. The enclosure as in claim 9 wherein the shielded material provides an attenuation of 70 dB to 80 dB of attenuation of a 1 GHz signal.

11. The enclosure as in claim 1 further comprising a connectable, ballistic, nylon cover.

12. The enclosure as in claim 1, further comprising at least one flexible or rigid corner section configured to connect the inflatable, lightweight beams.

13. The enclosure as in claim 1, wherein the at least one trunk comprises at least two branches, wherein a first branch is connected to a first section of the control system and a second branch is connected to a second section of the control system.

14. The enclosure as in claim 1, wherein the control system comprises at least one of PASC components, WGV components, or air generation and circulation components.

15. A method for providing an enclosure comprising:
   arranging one or more inflatable, lightweight beams to support a shielded material; and
   connecting a pressurized, lightweight shielded connection system comprising at least one pressurized, lightweight shielded connecting trunk to a control system and the enclosure, the at least one trunk comprises an inner trunk and an outer trunk, wherein at least one of said inner trunk or outer trunk is configured for air flow in one direction into the enclosure and wherein at least the other trunk is configured for air flow in an opposite direction.

16. The method as in claim 15 wherein the at least one connecting-trunk comprises a conductive Radio Frequency (RF) fabric.

17. The method as in claim 15 wherein the provided enclosure has a weight of approximately twenty-one pounds.

18. The method as in claim 15 wherein the shielded material comprises two layers of a shielded, attenuating fabric.

19. The method as in claim 18 wherein the shielded material provides an attenuation of 70 dB to 80 dB of attenuation of a 1 GHz signal.

20. The method as in claim 15 further connecting a ballistic, nylon cover.

* * * * *